(12) United States Patent
Nomura et al.

(10) Patent No.: US 7,769,069 B2
(45) Date of Patent: Aug. 3, 2010

(54) INTEGRATED SEMICONDUCTOR LASER DIODE MODULE AND MANUFACTURING METHOD OF THE SAME

(75) Inventors: Yasuhiko Nomura, Moriguchi (JP); Yasuyuki Bessho, Hirakata (JP); Masayuki Hata, Kadoma (JP); Tsutomu Yamaguchi, Nara (JP)

(73) Assignee: Sanyo Electric Co., Ltd., Osaka (JP)

( * ) Notice: Subject to any disclaimer, the term of this patent is extended or adjusted under 35 U.S.C. 154(b) by 241 days.

(21) Appl. No.: 11/067,472

(22) Filed: Feb. 28, 2005

(65) Prior Publication Data

US 2005/0232327 A1 Oct. 20, 2005

(30) Foreign Application Priority Data

Mar. 30, 2004 (JP) ............... 2004-100318

(51) Int. Cl.
*H01S 5/00* (2006.01)
(52) U.S. Cl. ................. 372/50.121
(58) Field of Classification Search .......... 372/50.12, 372/50.1, 50.121
See application file for complete search history.

(56) References Cited

U.S. PATENT DOCUMENTS

| | | | | |
|---|---|---|---|---|
| 5,060,237 A | * | 10/1991 | Peterson | 372/50.12 |
| 5,228,050 A | * | 7/1993 | LaCourse et al. | 372/50.121 |
| 5,402,436 A | | 3/1995 | Paoli | |
| 5,585,957 A | * | 12/1996 | Nakao et al. | 359/248 |
| 5,987,043 A | * | 11/1999 | Brown et al. | 372/36 |
| 6,136,623 A | * | 10/2000 | Hofstetter et al. | 438/28 |
| 2003/0007257 A1 | * | 1/2003 | Bell et al. | 359/719 |

FOREIGN PATENT DOCUMENTS

| | | |
|---|---|---|
| JP | 07-211991 | 8/1895 |
| JP | 07-307520 | 11/1995 |
| JP | 11-112091 | 4/1999 |
| JP | 2002-118331 A | 4/2002 |
| JP | 2002-232061 | 8/2002 |

OTHER PUBLICATIONS

Chinese Office Action, with English translation, issued in Chinese Patent Application No. CN 2005100084756, mailed Jan. 18, 2008.
Japanese Notification of Reasons for Refusal, w/ English translation thereof and Verification of translation, Issued in Japanese Patent Application No. JP 2004-100318 dated Mar. 9, 2010.

* cited by examiner

*Primary Examiner*—Minsun Harvey
*Assistant Examiner*—Patrick Stafford
(74) *Attorney, Agent, or Firm*—McDermott Will & Emery LLP

(57) ABSTRACT

Improving the lifetime of an integrated semiconductor laser diode module into which a GaN semiconductor laser diode and a GaP semiconductor laser diode are integrated, and the lasing properties of the laser diodes. Prior to a joining step of an LD 1 wafer that is made of a nitride semiconductor structure formed on a GaN substrate and an LD 2 wafer that is made of an aluminum gallium indium phosphide semiconductor structure, a facet of a resonator of the nitride semiconductor structure is formed by etching. A facet of a resonator of the aluminum gallium indium phosphide semiconductor structure is formed, after the joining step, by cleaving. The wafers are joined so that the facets of the resonators of the nitride semiconductor structure and aluminum gallium indium phosphide semiconductor structure are out of alignment in a lengthwise direction of the resonators.

9 Claims, 41 Drawing Sheets

LD1 WAFER

SECOND COATING

INTEGRATED SEMICONDUCTOR LASER DIODE MODULE AND MANUFACTURING METHOD OF THE SAME

BACKGROUND OF THE INVENTION (1) Field of the Invention

The present invention relates to an integrated semiconductor laser diode module and a manufacturing method thereof. More specifically, it relates to an integrated semiconductor laser diode module having a long lifetime and capable of low-threshold lasing and high output operation, and to a manufacturing method of such an integrated laser diode module.

(2) Description of the Related Art

In recent years, high capacity optical disc systems using red lasers as a light source for discs such as DVD-ROMs, DVD-RAMs, DVD-RWs, and DVD-Rs have been expanding the market. Further, various attempts in developing next generation high capacity optical disc systems using blue-violet lasers such as a Blu-ray disc system and an HD-DVD disc system have been made aggressively, with an increase of expectations for such disc systems. In developing such a next generation disc system, ensuring a compatibility with disc systems of the previous generation is an important key. Specifically, the DVD system had to be compatible with the CD system, and the Blu-ray and HD-DVD systems are required to be compatible with the DVD and CD systems. In order to achieve such compatibility, it is necessary that a next generation system is equipped with lasers having different wavelengths: 400 nm band, 650 nm band, and 780 nm band.

One solution to ensure the compatibility with the previous-generation system can be achieved by assembling different optical systems for different wavelengths in one disc system. However, this solution increases the production cost. A new solution that has been gaining attention is to use integrated semiconductor laser diode modules capable of emitting laser beams having two different wavelengths.

As one example, Japanese Laid-Open Patent Application No. 2002-118331 discloses such an integrated semiconductor laser diode module structured by a 400 nm band laser diode made of gallium nitride (AlGaInN) material and a 650 nm band laser diode made of aluminum gallium indium phosphide (AlGaInP) material that are joined together. The following explains the integrated semiconductor laser diode module disclosed in the JP 2002-118331.

FIG. 1 is a perspective view of the conventional integrated semiconductor laser diode module in which a 400 nm band laser diode made of gallium nitride (AlGaInN) material is joined to a 650 nm band laser diode made of aluminum gallium indium phosphide (AlGaInP) material.

This module is structured by a 400 nm band laser diode LD 3310 and a 650 nm band laser diode LD 3330 that are joined together by a joining member 3341. The joining member 3341 is made of a conductive material such as metal. The LD 3310 includes a sapphire substrate 3301 and a gallium nitride semiconductor layers laminated on the sapphire substrate, and the LD 3330 includes a GaAs substrate 3321 and an aluminum gallium indium phosphide semiconductor layers laminated on the GaAs substrate 3321. The LD 3310 and LD 3330 are ridge waveguide type, for example.

FIG. 2 is a sectional view of the LD 3310, taken at line of Y-Z shown in FIG. 1. The LD 3310 is such that an n-type contact layer 3401, an n-type clad layer 3402, an emission layer 3403, a p-type clad layer 3404, and a p-type contact layer 3405 are laminated on one main surface of the sapphire substrate 3301. The layers 3401-3405 are made of gallium nitride semiconductor. The p-type contact layer 3405 and the p-type clad layer 3404 are partially removed down to the middle of the p-type clad layer 3404, so as to form a ridge. A dielectric layer 3406 as a current blocking layer is formed on a side surface of the ridge and on the p-type clad layer 3404. Further, a p-side ohmic electrode 3311 and a p-side pad electrode 3312 are formed on the ridge. In addition, the LD 3310 includes an n-side ohmic electrode 3351 and an n-side pad electrode 3352 formed on an n-type electrode forming region, where the layers 3401-3405 are partially removed down to the middle of the n-type contact layer 3401.

FIG. 3 is a sectional view of the LD 3330, taken at line of Y-Z shown in FIG. 1. The LD 3330 is such that an n-type clad layer 3501, an emission layer 3502, a p-type clad layer 3503, and a p-type contact layer 3504 are laminated on one main surface of the GaAs substrate 3321. The layers 3501-3504 are made of aluminum gallium indium phosphide semiconductor. The p-type contact layer 3504 and the p-type clad layer 3503 are partially removed down to the middle of the p-type clad layer 3503, so as to form a ridge. A dielectric layer 3505 as a current blocking layer is formed on a side surface of the ridge and on the p-type clad layer 3503. Further, a p-side ohmic electrode 3331 and a p-side pad electrode 3332 are formed on the ridge. In addition, an n-side ohmic electrode 3361 and an n-side pad electrode 3362 are formed on the other main surface of the GaAs substrate 3321.

The LD 3310 and LD 3330 are joined together with the joining member 3341, thereby structuring the integrated semiconductor laser diode module as illustrated in FIG. 1. The p-side pad electrodes 3312 and 3332 have the same potential because the p-side pad electrodes 3312 and 3332 are connected to each other by the joining member 3341 that is conductive, and the p-side pad electrode 3312 of the LD 3310 is used as a common electrode. By supplying the current between the p-side pad electrode 3312 and n-side pad electrode 3352, the LD 3310 is operated and emits 400 nm band laser beams. Further, by supplying the current between the p-side pad electrode 3312 and n-side pad electrode 3362, the LD 3330 is operated and emits 650 nm band laser beams.

It is extremely difficult to join the LD 3310 and LD 3330 with matching both directions of the ridges and the crystallography directions between the LD 3310 and LD 3330. This also makes it extremely difficult to make the facets flat for both laser diodes with the conventional manufacturing method, by which all facets of the resonators are formed at the same time. As shown in FIG. 1, if the facets are formed based on cleavage planes of the semiconductor that structures the LD 3330, numerous stripes due to uneven surface appear on the facets of the resonator of the LD 3310. The following explains about this problem in detail with reference to FIGS. 4-9, by showing an example of steps for manufacturing the conventional integrated semiconductor laser diode module.

As shown in FIG. 4, the layers 3401-3405 made of the gallium nitride semiconductor are laminated on the sapphire substrate 3301. Then, as shown in FIG. 5, a ridge 3701 in a stripe shape is formed using a common photolithographic technique and an etching technique, and then the dielectric layer 3406, p-side ohmic electrode 3311, and p-side pad electrode 3312 are formed respectively at desired regions.

Further, as shown in FIG. 6, the layers 3501-3504 made of the aluminum gallium indium phosphide semiconductor are laminated on the GaAs substrate 3321. Then, as shown in FIG. 7, a ridge 3901 in a stripe shape is formed using the common photolithographic technique and etching technique, and then the dielectric layer 3505, p-side ohmic electrode 3331, and p-side pad electrode 3332 are formed respectively at desired regions.

Next, as shown in FIG. 8, the wafers are joined by the joining member 3341 so that the p-side pad electrodes 3312 and 3332 face each other. At this time, it is difficult to join the wafers so that the stripe shaped ridges are accurately in parallel. FIG. 9 is a schematic view that illustrates this problem. As shown in the drawing, the wafers are not in parallel in the direction of the ridges (3701 and 3901), and an error Δθ in angle occurs. Specifically, the crystallographic directions of the wafers are not aligned. When forming a resonator by cleaving after joining two wafers in such a way, it is not possible to obtain flat cleavage planes for both laser diodes. As a result, the facets of the resonator of the laser diode (LD 3310) become uneven.

As described above, it is not possible, with the conventional integrated semiconductor laser diode module, to form all of the facets of the laser diodes integrated in one module evenly, which is ideal. The uneven facets make light guided inside a laser diode scatter, and also makes it difficult to cause laser oscillation. This causes an increase in a threshold current. In addition, the unevenness on the facets could increase nonradiation centers on the facets, which results in higher light absorption at the facets. Consequently, the facets could deteriorate and it becomes difficult to perform high output operation. Further, these factors give an adverse effect to the lifetime of the laser diodes.

Moreover, in the case of the integrated semiconductor laser diode module shown in FIG. 1, the AlGaInN laser diode and an AlGaInP laser diode are joined facing each other. Because both coefficients of thermal expansion (CTE) and crystal structures are greatly differ between an AlGaInN material and an AlGaInP material (the AlGaInN material has a wurtzite structure, while the AlGaInP material has a zincblende structure), heat generated when driving one laser could distort the other laser. As a result, this could shorten the lifetime of the laser diodes.

SUMMARY OF THE INVENTION

The present invention is made in order to solve the above problems, and aims to provide an integrated laser diode module having a long lifetime and capable of low-threshold lasing and high output operation, and to a method of manufacturing such an integrated laser diode module.

In order to achieve the above object, an integrated semiconductor laser diode module according to the present invention comprises a first semiconductor laser diode having a first resonator, and a second semiconductor laser diode having a second resonator whose length is different from a length of the first resonator, wherein the first laser diode is joined to the second laser diode in a manner that the first resonator and second resonator are substantially parallel in a lengthwise direction thereof, and at least one of (a) emitting facets of the first resonator and second resonator, and (b) reflecting facets of the first resonator and second resonator are not on the same plane.

In the above structure, the resonator of one of the laser diodes is longer than the resonator of the other laser diode. There is a space in vicinity of the facet of the shorter resonator. As a result, it is possible to suppress the distortions to the laser diode having the shorter resonator, even if the temperature rises by driving the other laser diode.

Further, by making the first and second resonators different in length, the emitting facets of the both resonators are not on the same plane. Accordingly, when the temperature rises by driving one of the laser diodes in the integrated semiconductor laser diode module, the extent of distortions that one of the laser diode could receive from the other laser diode can be largely reduced because the emitting facets where the temperature rise is remarkable are not on the same plane. As a result, it is possible to dramatically improve the lifetime of the integrated semiconductor laser diode module.

In order to achieve the above object, a manufacturing method of an integrated semiconductor laser diode module according to the present invention comprises a first wafer forming step of forming a first wafer by making, on a first substrate, at least one first laser diode structure having a first resonator, a second wafer forming step of forming a second wafer by making, on a second substrate, at least one second laser diode structure having a second resonator, a joining step of joining the first wafer and second wafer, and a facet forming step of forming, to the first resonator of the first wafer, at least one facet out of an emitting facet and a reflecting facet, wherein the facet forming step is performed prior to the joining step.

By such a method, at least one of the facets out of the emitting facet and the reflecting facet of the first laser diode can be formed so as to match a crystallography direction of the semiconductor of the first laser didde structure before joining the wafers. Accordingly, the facets of the first laser diode become flat. As a result, it is possible to manufacture the integrated semiconductor laser diode module having the first laser diode having a long lifetime and capable of low-threshold lasing, high output operation.

The above integrated semiconductor laser diode module may also be such that the emitting facets of the first resonator and second resonator are not on the same plane.

By the above structure, when driving one of the laser diode, it is possible to suppress the heat conduction from the emitting facet of the driving laser diode, where the temperature rise is the most notable, to the emitting facet of the other laser diode. Accordingly, the lifetime of the integrated semiconductor laser diode module can be greatly improved.

The above integrated semiconductor laser diode module may also be such that the reflecting facets of the first resonator and second resonator are not on the same plane.

By the above structure, when driving one of the laser diode, it is possible to suppress the heat conduction from the reflecting facet of the driving laser diode, where the temperature rise is the second notable, to the reflecting facet of the other laser diode. Accordingly, the lifetime of the integrated semiconductor laser diode module can be greatly improved.

The above integrated semiconductor laser diode module may also be such that the first laser diode and second laser diode are made of different semiconductor materials.

By the above structure where the first laser diode and second laser diode are made of different semiconductor materials, CETs of the materials are also different. Therefore, when driving one of the laser diodes raises the temperature, a large distortions to the other laser diode can be caused. According to the present invention, however, it is possible to suppress such distortions effectively even in such a case, because the facets of the both laser diodes, where the temperature rise is the most notable in the respective laser diodes, are not on the same plane. Accordingly, the lifetime of the integrated semiconductor laser diode module can be improved even more greatly.

The above integrated semiconductor laser diode module may also be such that the first laser diode and second laser diode have different crystal structures.

By the above structure, when the crystal structures of the first laser diode and second laser diode are different, a larger distortions can be caused. However, because the facets of the both laser diodes, where the temperature rise is the most notable in the respective laser diodes, are not on the same plane, it is possible to suppress such distortions effectively. Accordingly, the lifetime of the integrated semiconductor laser diode module can be improved even more greatly.

Further, one of the first laser diode and second diode may be made of a nitride semiconductor.

In the above structure, the nitride semiconductor laser diode has a wurtzite structure, which is different from a structure of other semiconductor laser diodes having a zinc blende structure, such as gallium arsenide, aluminum gallium indium phosphide, and indium phosphide. This causes the distortions rather easily when the nitride semiconductor laser diode and another semiconductor laser diode are joined together into one integrated semiconductor laser diode module. Therefore, in such a case, an effect of suppressing the distortions can be achieved more remarkably. As a result, the effect of the improved lifetime of the integrated semiconductor laser diode module becomes even more remarkable. Especially, in a case of the nitride semiconductor laser diode formed by the layers laminated in a c-axis direction ((0001) crystal orientation), electric fields resulted from distortions called piezoelectric fields are inherent. Because of the piezoelectric fields, electrons and holes can be easily separated spatially in the laser diode and radiative recombination does not occur very easily. When the temperature rises by driving the other laser diode that is integrated into one module along with the nitride semiconductor laser diode, a great deal of distortions can be caused to the nitride semiconductor laser diode. As a result, the piezoelectric fields increase, and it becomes harder to cause the radiative recombination. According to the present invention, however, the effect of the improved lifetime of the integrated semiconductor laser diode module is remarkable even in such a case, because the emitting facets of the both resonators are not on the same plane. As a result, it is possible not only to achieve an effect that the lifetime of the integrated semiconductor laser diode module can be improved even more remarkably, but also to suppress the deterioration of the property of the laser diode, such as an increase of the threshold current and a decrease of the luminous efficiency.

The above integrated semiconductor laser diode module may also be such that the first laser diode is made of a nitride semiconductor, a first coating film is formed on the emitting facet of the first laser diode, and a second coating film is formed on the first coating film and the emitting facet of the second laser diode.

By the above structure, it is possible to set the most appropriate reflectance for the respective coating films to the facets of the first laser diode and second laser diode. As a result, the properties of laser diodes that are integrated into one module can be separately optimized.

Further, the above manufacturing method may also be such that the at least one facet formed in the facet forming step includes the emitting facet.

By the above structure, it is possible to accurately process the emitting facet of the first laser diode whose surface is required to be more flat than other facets. As a result, the integrated semiconductor laser diode module having excellent properties can be obtained.

The above manufacturing method may also be such that the at least one facet is formed by etching in the facet forming step.

According to the above method, it is possible to form a flat facet easily by etching.

The above manufacturing method may further comprise a first coating step of forming a first coating film on the at least one facet that has been formed, and a second coating step of forming a second coating film on the first coating film and a facet of the second resonator, wherein the first coating step is performed after the facet forming step and prior to the joining step, and the second coating step is performed after the joining step.

By using the above method, the first coating film is formed on the first laser diode before the joining. Accordingly, the reflectance of the first coating film is controlled separately from the second coating film. As a result, it is possible to make the reflectance at the facets to be the most appropriate respectively for the first laser diode and second laser diode.

The above manufacturing method may also be such that the first substrate and second substrate are different in at least one of material and surface orientation.

By using the above method, effects of reducing threshold current and increasing luminous efficiency are achieved more remarkably.

The above manufacturing method may also be such that the first laser diode structure and second laser diode structure are made of different semiconductor materials.

By using the above method, the effects of reducing threshold current and increasing luminous efficiency are achieved more remarkably.

The above manufacturing method may further comprise an electrode forming step of forming an n-side ohmic electrode and an n-side pad electrode to a first laser diode and a second laser diode, and a polishing step of polishing back surfaces of the first substrate and second substrate, the back surfaces being opposite to surfaces on which the respective laser diode structures are formed, wherein the electrode forming step is performed after the joining step, and the polishing step is performed prior to the electrode forming step.

By using the above method, damages to the wafers from polishing the substrates can be suppressed effectively in comparison with a case in which the polishing is performed to the substrate of a single wafer before joining, because the combined body of the wafers is stronger than a single wafer (the first wafer or second wafer). As a result, production yield can be largely improved.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENTS

The following describes an integrated semiconductor laser diode module according to preferred embodiments of the present invention with reference to the drawings.

First Embodiment

Figure 1:
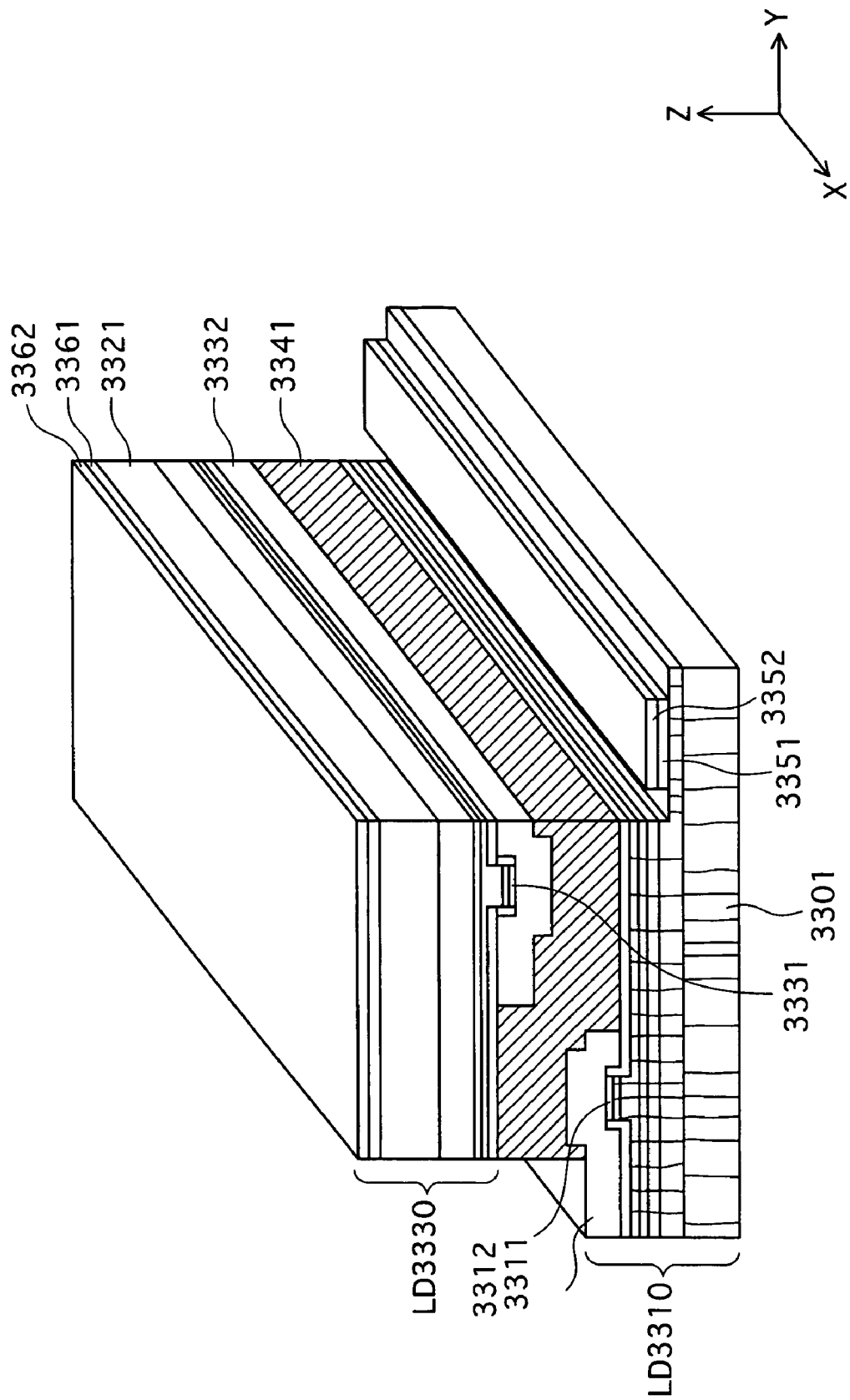
FIG. 1 is a perspective view of the conventional integrated semiconductor laser diode module including a gallium nitride material and an aluminum gallium indium phosphide material.
Figure 2:
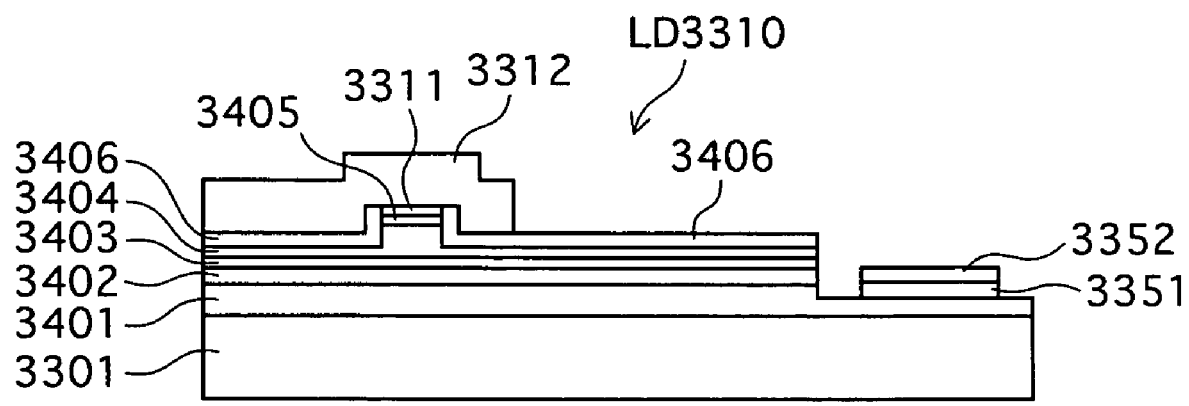
FIG. 2 is a is a sectional view of a laser diode made of the gallium nitride material.
Figure 2:
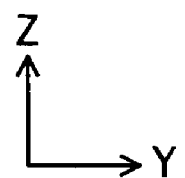
Figure 3:
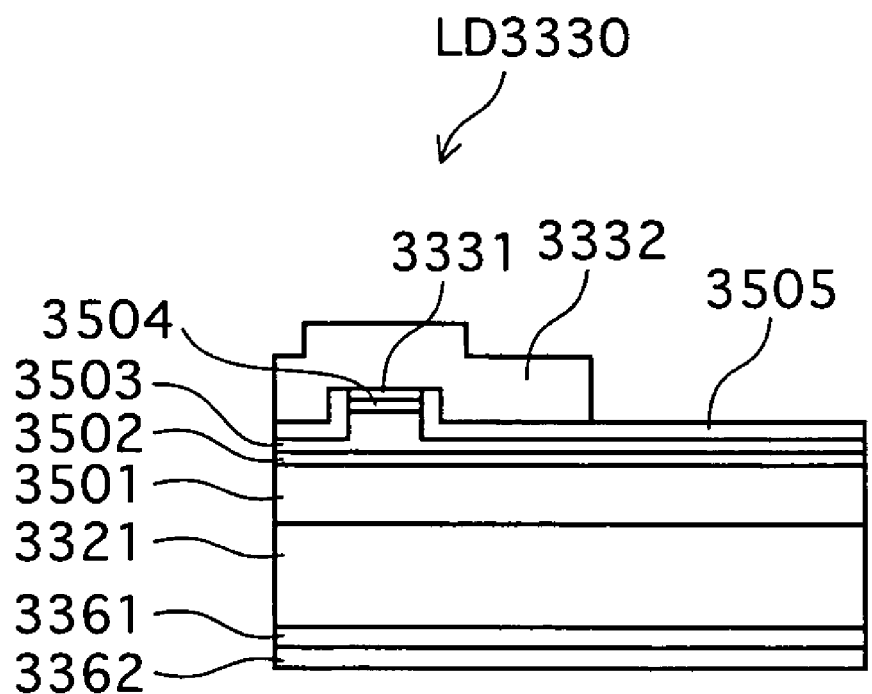
FIG. 3 is a sectional view of a laser diode made of the aluminum gallium indium phosphide material.
Figure 3:
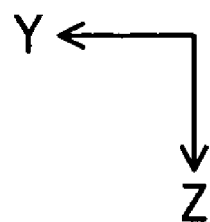
Figure 4:
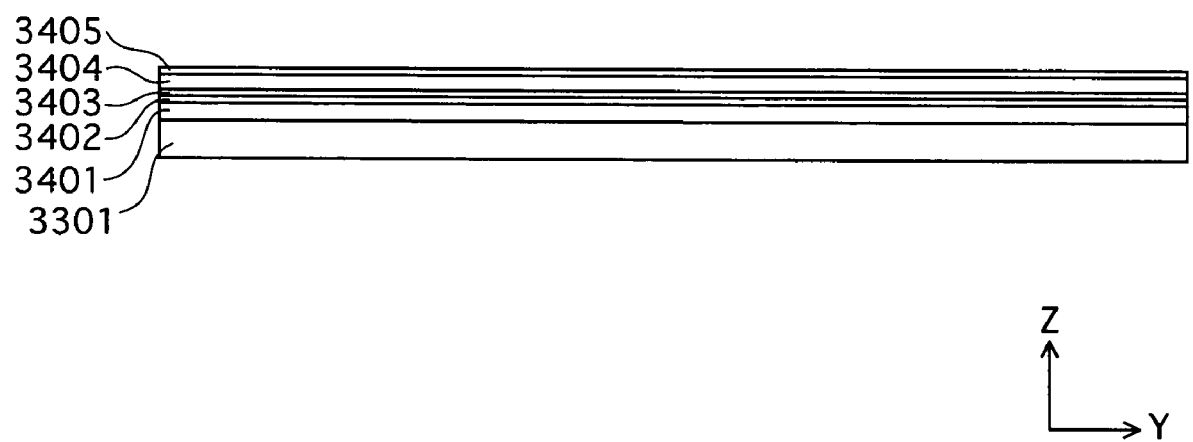
FIG. 4 illustrates a first part of steps of manufacturing the conventional integrated semiconductor laser diode module.
Figure 5:
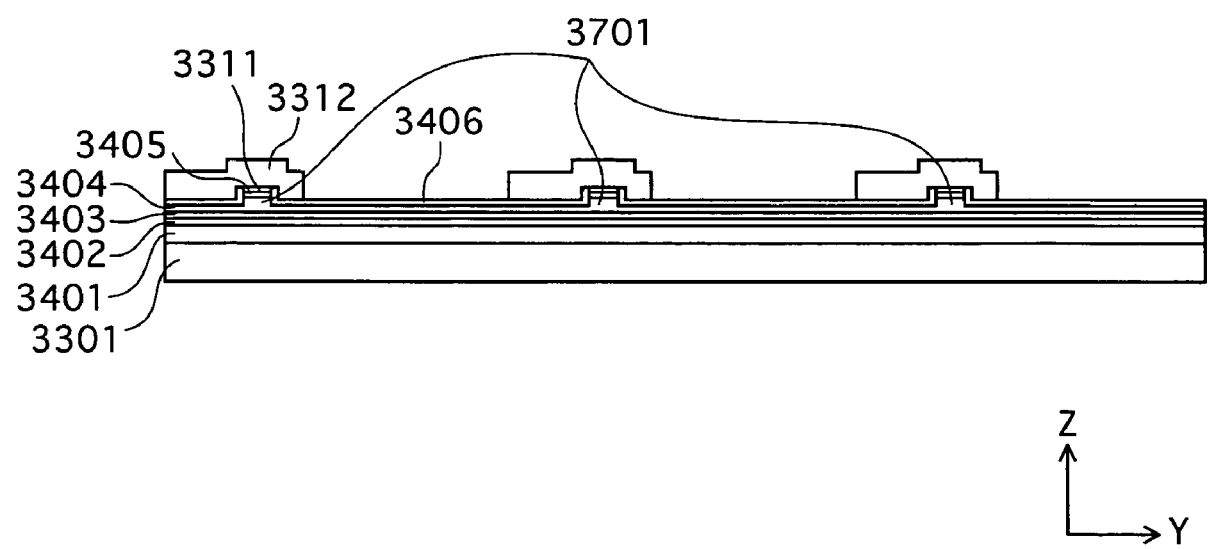
FIG. 5 illustrates a second part of the steps of manufacturing the conventional integrated semiconductor laser diode module.
Figure 6:
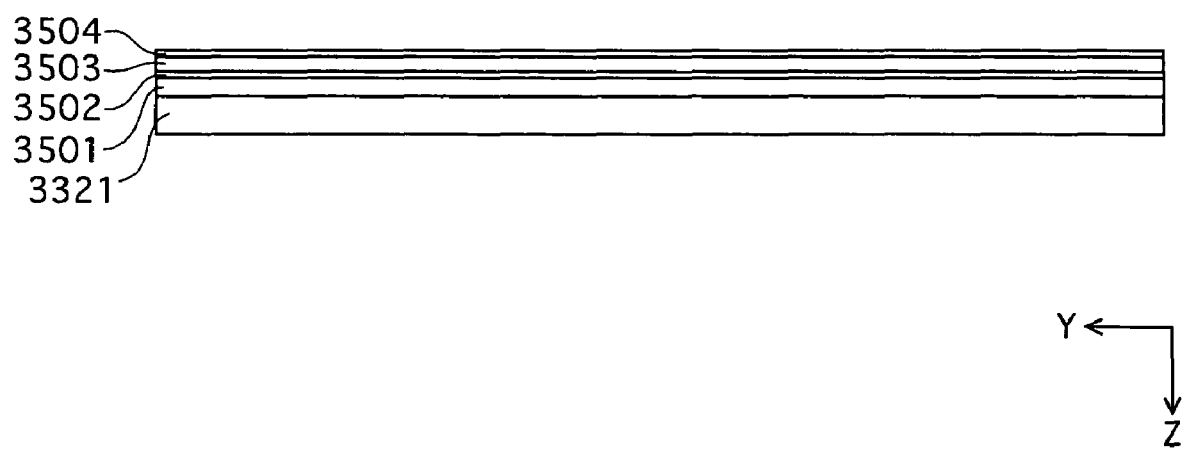
FIG. 6 illustrates a third part of the steps of manufacturing the conventional integrated semiconductor laser diode module.
Figure 7:
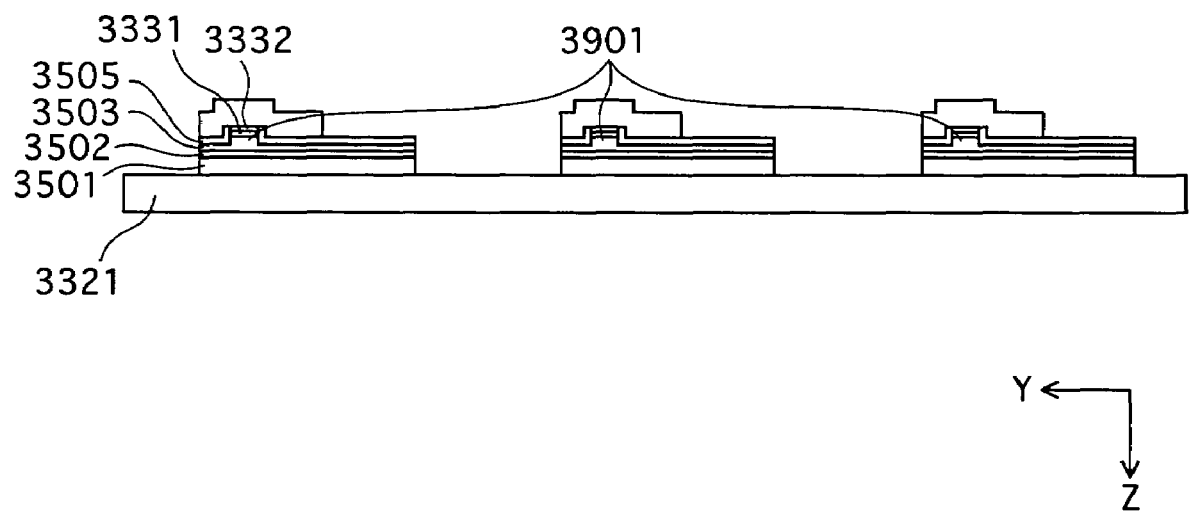
FIG. 7 illustrates a fourth part of the steps of manufacturing the conventional integrated semiconductor laser diode module.
Figure 8:
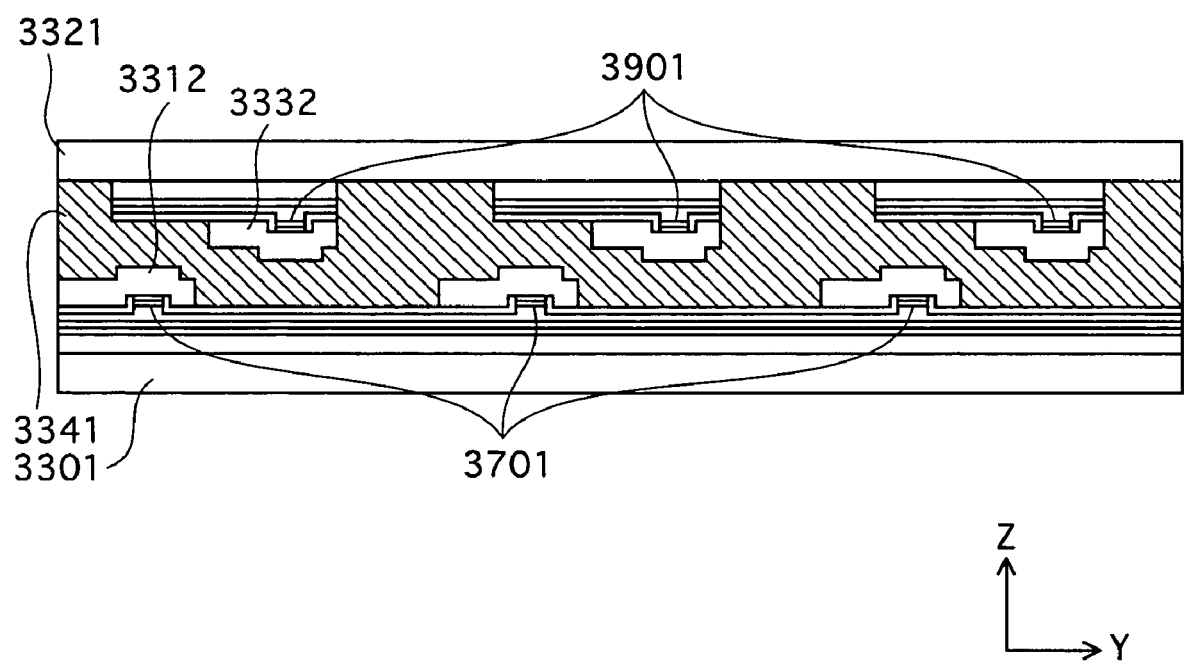
FIG. 8 illustrates a fifth part of the steps of manufacturing the conventional integrated semiconductor laser diode module.
Figure 9:
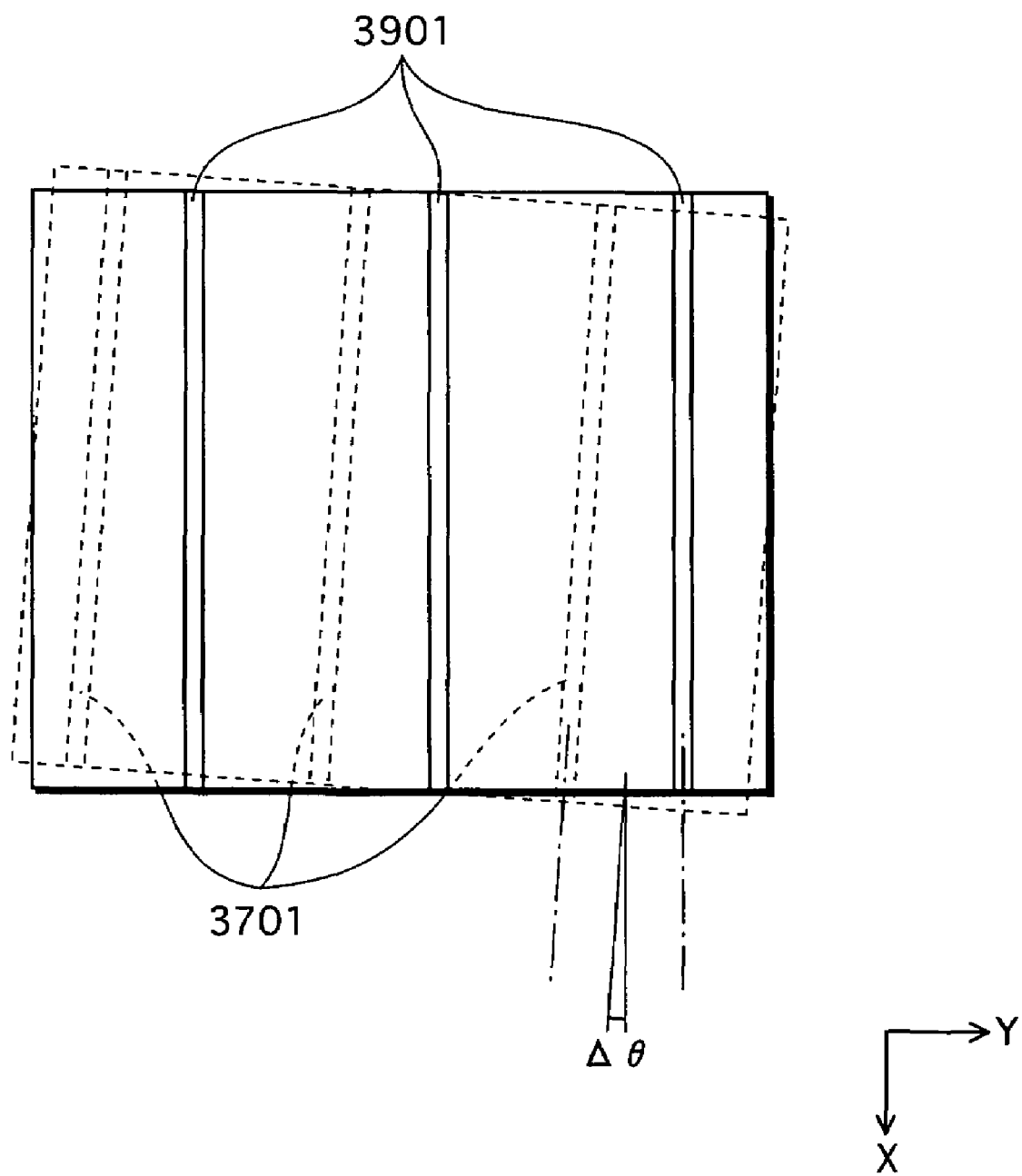
FIG. 9 illustrates a sixth part of the steps of manufacturing the conventional integrated semiconductor laser diode module.
Figure 10:
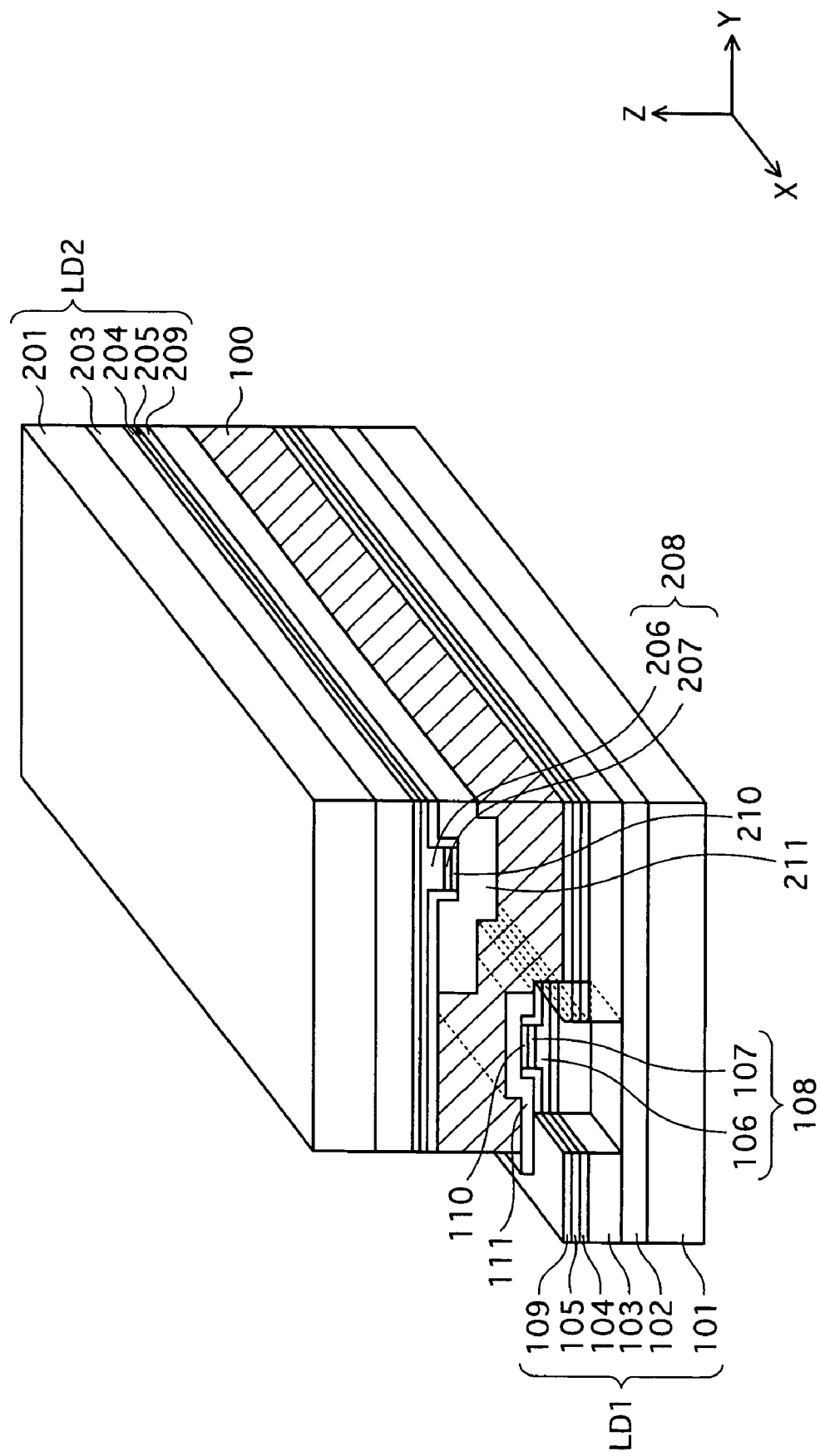
FIG. 10 is a schematic perspective view illustrating a structure of an integrated semiconductor laser diode module of a first embodiment according to the present invention.
Figure 11:
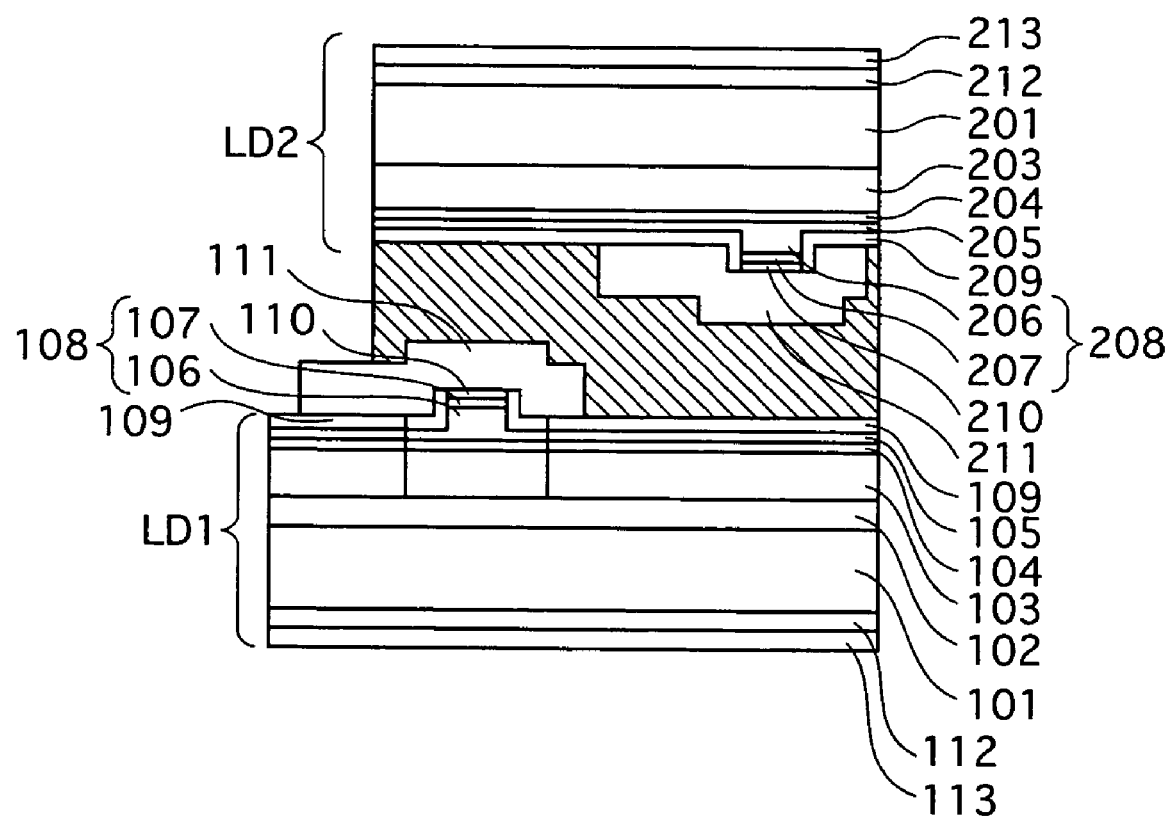
FIG. 11 is a schematic sectional view of the integrated semiconductor laser diode module of the First Embodiment.
Figure 11:
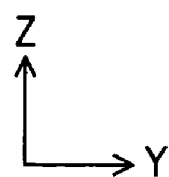

FIG. 10 is a schematic perspective view illustrating a structure of an integrated semiconductor laser diode module of a First Embodiment according to the present invention. FIG. 11 is a schematic sectional view of the integrated semiconductor laser diode module. The integrated semiconductor laser diode module is such that a 400 nm band laser diode LD 1 made of gallium nitride semiconductor and a 650 nm band laser diode LD 2 made of aluminum gallium indium phosphide semiconductor are joined together by a joining member 100 so as to be integrated.

The LD 1 has a structure described below. On an n-type GaN (0001) substrate 101 that is 70 μm thick, an undoped n-type layer 102 that is about 1 μm thick and made of $Al_{0.01}Ga_{0.99}N$ is formed. On the n-type layer 102, an n-type clad layer 103 that is about 1 μm thick and made of $Al_{0.07}Ga_{0.93}N$ is formed. On the n-type clad layer 103, an emission layer 104 is formed. The emission layer 104 includes a Multiple Quantum Well (MQW) active layer having an MQW structure, a light guiding layer, and a carrier blocking layer. The MQW active layer includes three quantum well layers each of which is about 3.5 nm thick and made of undoped $In_xGa_{1-x}N$, and three barrier layers each of which is about 20 nm thick and made of undoped $In_yGa_{1-y}N$ and each quantum well layer and each barrier layer are laminated alternately. Here, x>y, where x=0.15 and y=0.05.

On an upper surface of the MQW active layer, a p-type light guiding layer that is about 0.1 μm thick and made of undoped $In_{0.01}Ga_{0.99}N$ is formed, and a p-type carrier blocking layer that is about 20 nm thick and made of Mg doped $Al_{0.25}Ga_{0.75}N$ is formed on the p-type light guiding layer. Further, below a lower surface of the MQW active layer, an n-type carrier blocking layer made of undoped $Al_{0.25}Ga_{0.75}N$ is formed. The emission layer 104 includes the above described gallium nitride semiconductor layers.

On the emission layer 104, a p-type clad layer 105 having a protrusion is formed by Mg doped $Al_{0.07}Ga_{0.93}N$. The p-type clad layer 105 is about 0.4 μm thick at the protrusion 106, and about 0.05 μm thick at the rest of the p-type clad layer 105.

On an upper surface of the protrusion 106 of the p-type clad layer 105, a p-type contact layer 107 that is about 3 nm thick and made of $In_{0.01}Ga_{0.99}N$ is formed. A ridge 108 is formed by the protrusion 106 of the p-type clad layer 105 and the p-type contact layer 107. The ridge 108 is about 1.5 μm wide.

On side surfaces of the ridge 108 and an upper surface of a flat plane of the p-type clad layer 105, a dielectric layer 109 that is about 0.2 μm thick and made of $SiO_2$ is formed. The dielectric layer 109 supplies a current only to the ridge 108, and serves as a current blocking layer that controls a refractive index difference in a widthwise direction of the laser diode.

Further, on an upper surface of the ridge 108, i.e. on an upper surface of the -type contact layer 107, a stripe-shaped p-side ohmic electrode 110, in which an about 1 nm thick Pt layer, an about 100 nm thick Pd layer, an about 240 nm thick Au layer, and an about 240 nm thick Ni layer are laminated from bottom to top, is formed. In addition, on upper surfaces of the p-side ohmic electrode 110 and dielectric layer 109, a p-side pad electrode 111, in which an about 100 nm thick Ti layer, an about 150 nm thick pt layer, and an about 3 μm thick Au layer are laminated from bottom to top, is formed so as to be in contact with the upper surface of the p-side ohmic electrode 110.

Moreover, on a back surface of the n-type GaN substrate 101, an n-side ohmic electrode 112 (not depicted in FIG. 10) is formed. The n-side ohmic electrode 112 is such that an about 6 nm thick Al layer, an about 2 nm thick Si layer, an about 10 nm thick Ni layer, and an about 100 nm thick Au layer are laminated in a stated order over the back surface of the n-type GaN substrate 101. On a surface of the n-side ohmic electrode 112 that faces away from the n-type GaN substrate 101, the n-side pad electrode 113 (not depicted in FIG. 10) is formed. The n-side pad electrode 113 is such that an about 10 nm thick Ni layer and an about 700 nm thick Au layer are laminated in a stated order over the n-side ohmic electrode 112.

On the other hand, the LD 2 shown in FIGS. 10 and 11 has a structure described below. On an n-type GaAs (001) substrate 201 that is 100 μm thick, an n-type clad layer 203 that is about 1 μm thick and made of $(Al_{0.7}Ga_{0.3})_{0.5}In_{0.5}P$ is formed. Note that the n-type clad layer 203 may be formed over the substrate 201 with a buffer layer, made of such as an n-type GaAs and an n-type GaInP, interposed therebetween, although the n-type clad layer 203 is directly formed on the substrate in this embodiment.

On the n-type clad layer 203, an emission layer 204 is formed. The emission layer 204 includes an MQW active layer having the MQW structure and a light guiding layer. The MQW active layer is such that a quantum well layer and a barrier layer are laminated alternately, and includes three quantum well layers each of which is about 5 nm thick and made of $(Al_aGa_{1-a})_{0.5}In_{0.5}P$, and four barrier layers each of which is about 5 nm thick and made of undoped $(Al_bGa_{1-b})_{0.5}In_{0.5}P$. Here, a<b, where a=0 and b=0.5.

On an upper surface of the MQW active layer, a p-type light guiding layer that is about 60 nm thick and made of undoped $(Al_{0.5}Ga_{0.5})_{0.5}In_{0.5}P$ is formed. Further, on a lower surface of the MQW active layer, an n-type light guiding layer layer made of undoped $(Al_{0.5}Ga_{0.5})_{0.5}In_{0.5}P$ is formed. The emission layer 204 includes the above described aluminum gallium indium phosphide semiconductor layers.

On the emission layer 204, a p-type clad layer 205 having a protrusion is formed by Mg doped $(Al_{0.7}Ga_{0.3})_{0.5}In_{0.5}P$. The p-type clad layer 205 is about 1.2 μm thick at the protrusion 206, and about 0.2 μm thick at the rest of the p-type clad layer 205.

On an upper surface of the protrusion 206 of the p-type clad layer 205, a p-type contact layer 207 that is about 0.3 μm thick and made of GaAs is formed. The protrusion 206 of the p-type clad layer 205 and the p-type contact layer 207 form a ridge 208. The ridge 208 is about 2.0 μm wide.

On side surfaces of the ridge 208 and an upper surface of a flat plane of the p-type clad layer 205, a dielectric layer 209 that is about 0.2 μm thick and made of $SiO_2$ is formed. The dielectric layer 209 supplies current only to the ridge 208, and serves as a current blocking layer that controls a refractive index difference in a widthwise direction of the laser diode.

Further, on an upper surface of the ridge 208, i.e. on an upper surface of the p-type contact layer 207, a stripe-shaped p-side ohmic electrode 210 made of Au and Zn is formed. In addition, on upper surfaces of the p-side ohmic electrode 210 and dielectric layer 209, a p-side pad electrode 211, in which an about 100 nm thick Ti layer, an about 150 nm thick Pt layer, and an about 3 μm thick Au layer are laminated from bottom to top, is formed so as to be in contact with the upper surface of the p-side ohmic electrode 210.

Moreover, on a back surface of the n-type GaAs substrate 201, an n-side ohmic electrode 212 (not depicted in FIG. 10) made of Au and Ge is formed. On a surface of the n-side ohmic electrode 212 that faces away from the n-type GaAs substrate 201, the n-side pad electrode 213 (not depicted in FIG. 10) is formed. The n-side pad electrode 213 is such that an about 10 nm thick Ni layer and an about 700 nm thick Au layer are laminated in a stated order over the n-side ohmic electrode 212.

Note that the wordings such as "upper surface" is defined as a side of the substrate on which the semiconductor layers are formed before joining of the wafers ("down" and "bottom" are on an opposite side). Further, the back surface is defined as a side opposite to a direction of crystal growth for the substrate before joining of the wafers.

Figure 12:
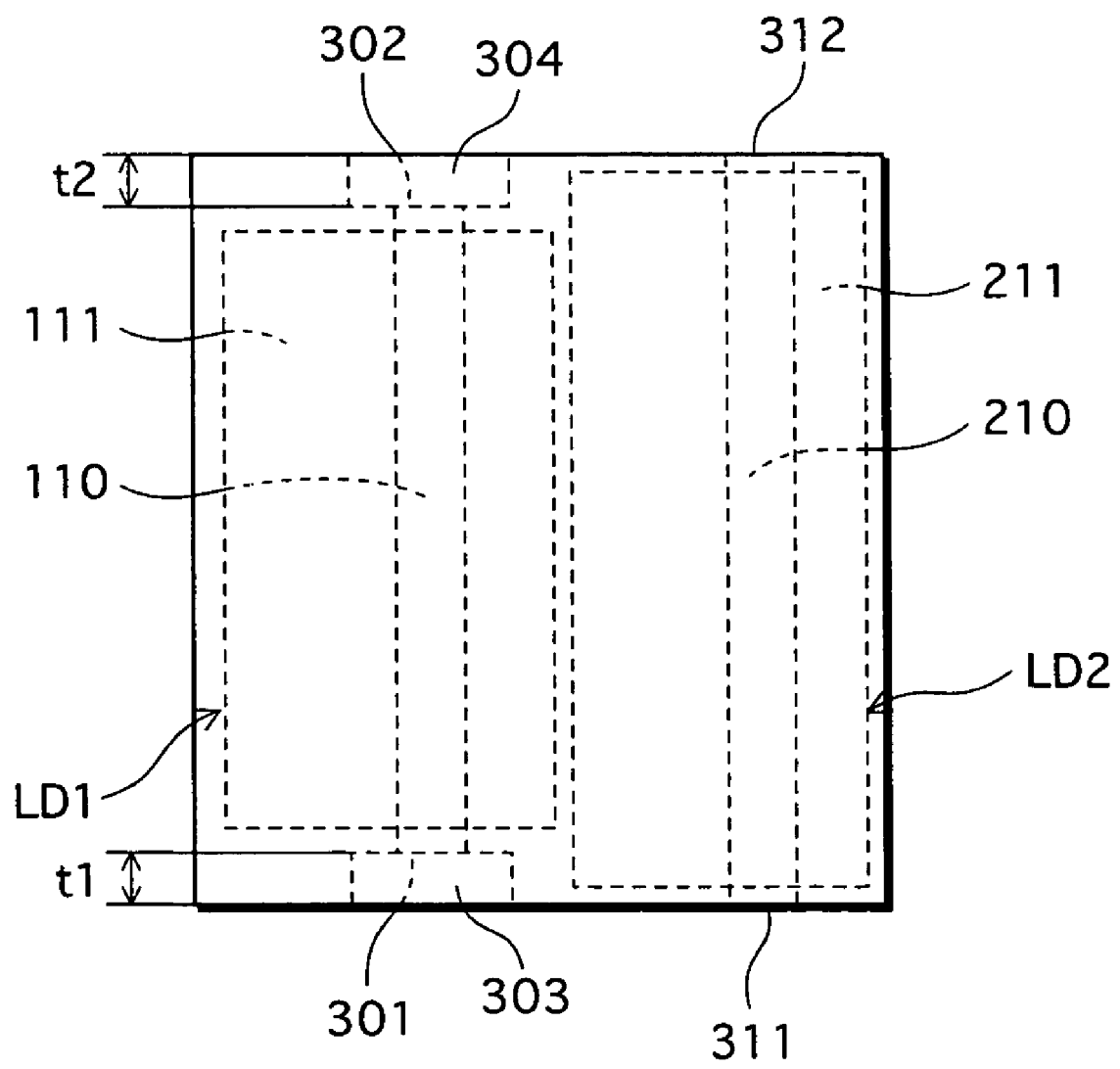
FIG. 12 is a plane view illustrating the integrated semiconductor laser diode module in FIGS. 10 and 11.
Figure 12:
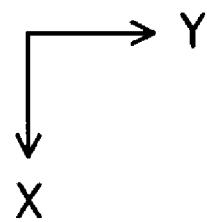

FIG. 12 is a plane view illustrating the integrated semiconductor laser diode module in FIGS. 10 and 11. In order to simplify the drawing, only the components needed in the following explanation are shown in dashed lines with the same reference as in FIGS. 10 and 11.

Prior to the wafer joining, facets 301 and 302 of a resonator of the LD 1 are formed so as to be substantially perpendicular to the GaN substrate 101, using the photolithographic technique and dry etching technique to the upper surface of the LD 1. The facets 301 and 302 refer to two ends between which light confined in the resonator reciprocates. As an example of the dry etching technique, reactive ion etching (RIE) using a $Cl_2$ gas may be used. A resonator length (a distance between the facets 301 and 302) is about 600 μm. The direction in which the ridge 108 lies (the same direction in which the p-side ohmic electrode 110 lies) can be roughly matched with a crystal plane orientation of the GaN substrate 101 by the photolithographic technique. Further, because the facets 301 and 302 are formed by setting the direction in which the ridge 108 lies as a standard, it is possible to form the facets 301 and 302 so as to match a desired crystal plane orientation. As a result, it is possible to obtain the flat facets 301 and 302.

After the wafer joining, facets 311 and 312 of a resonator of the LD 2 are formed by cleaving the joined wafers. In order to join the wafers, a solder including Au and Sn may be used as the joining member 100. A resonator length of the LD 2 (a distance between the facets 311 and 312) is about 800 μm.

The direction in which the ridge 208 of the LD 2 lies (the same direction in which the p-side ohmic electrode 210 lies) can be roughly matched with a crystal plane orientation of the GaAs substrate 201 by the photolithographic technique. Further, in the cleaving, because the facets 311 and 312 are formed by setting the direction in which the ridge 208 lies as a standard, it is possible to form the facets 311 and 312 so as to match a desired crystal plane orientation. As a result, it is possible to obtain the flat facets 311 and 312.

As shown in FIG. 12, the LD 1 and LD 2 are joined in a manner such that the facet 301 of the LD 1 and the facet 311 of the LD 2 are out of alignment by a distance t1 in the direction in which the resonators lie, and the facet 302 of the LD 1 and the facet 312 of the LD 2 are out of alignment by a distance t2 in the direction in which the resonators lie. In the present embodiment, the LD 1 and LD 2 are joined so that the distances t1 and t2 are both 100 μm.

As described above, according to the present invention, the forming of the facets 301, 302, 311, and 312 of the LD 1 and LD 2 are separately controlled based on the directions in which the ridge 108 and 208, which are formed based on the crystal plane orientations of the respective substrates 101 and 102. Therefore, even when the an error in angle occurs in the wafer joining, it is possible to form the facets 301, 302, 311, and 312 so as to respectively match the desired crystal plane orientations.

Thus, the flatness of the facets 301, 302, 311, and 312 are improved, and it is possible to reduce the threshold current, increase the light output, and extend the lifetime of the laser diodes.

Further, the integrated semiconductor laser diode module of the First Embodiment as shown in FIGS. 10, 11, and 12 is a module into which the gallium nitride the laser diode LD 1 having wurtzite structure, and the aluminum gallium indium phosphide semiconductor laser diode LD 2 having zincblende structure are integrated. As shown in the perspective view of FIG. 10 and FIG. 12, the resonator length of the LD 1 is shorter than the resonator length of the LD 2, and there are spaces 303 and 304 respectively in vicinity of the facets 301 and 302 of the LD 1.

Here, when driving the LD 2, a temperature at the emission layer 204 of LD 2 rises. Especially, because the light intensity in vicinity of the facets 311 and 312 is high, the rise in the temperature in these areas is notable. The LD 2 thermally expands with the generation of the heat. Also, the generated heat is conducted to the LD 1 via the ridge 208, the p-type contact layer 207, the p-side ohmic electrode 210, the p-side pad electrode 211, and the joining member 100. As a result, the temperature at the LD 1 also rises and the LD 1 thermally expands. As described above, the gallium nitride material and the aluminum gallium indium phosphide material have the different crystal structures and CETs. The conducted heat, thus, can cause the distortions to the LD 1. However, the spaces 303 and 304 that are respectively in vicinity of the facets 301 and 302 of the LD 1 greatly contribute to reduce the distortions caused to the LD 1, in comparison with the conventional integrated semiconductor laser diode module in which two laser diodes having the same resonance length (there are no spaces in vicinity of facets). As a result, the lifetime of the LD 1 is dramatically improved.

Further, because the facets 301 and 302 of the LD 1 are not on the same plane with the facets 311 and 312 of the LD 2, the generated heat cannot be easily conducted from the facets of one of the laser diode that is driven, to the facets of the other laser diode. As a result, the lifetime of the LD 1 is dramatically improved.

Especially in the case of the present invention, the nitride semiconductor layers 102 to 105, and 107 of the LD 1 are laminated in a direction of c-axis ((0001) crystal orientation), and therefore electric fields resulted from distortions called piezoelectric fields are inherent. Because of such electric fields, electrons and holes can be easily separated spatially in the laser diode. Thus, radiative recombination does not occur very easily. Further, when the temperature rises by driving the LD 2, the distortions of the LD 1 can be greater, and this can make it harder for the radiative recombination to occur. However, also according to the present invention, the facets 311 and 312 of the LD 2, where the temperature rise is the most notable, are not on the same planes with the facets 301 and 302 of the LD 1, respectively. Therefore the extent of the distortions of the LD 1 can be greatly reduced in comparison with the conventional integrated semiconductor laser diode module in which the corresponding facets are on the same planes. As a result, it is possible not only to achieve an effect that the lifetime of the integrated semiconductor laser diode module can be improved even more conspicuously, but also to suppress the deterioration of the property of the laser diode including an increase of the threshold current and a decrease of the luminous efficiency.

The following explains a method of manufacturing the integrated semiconductor laser diode module according to the present embodiment with reference to FIGS. 13 to 30.

Figure 13:
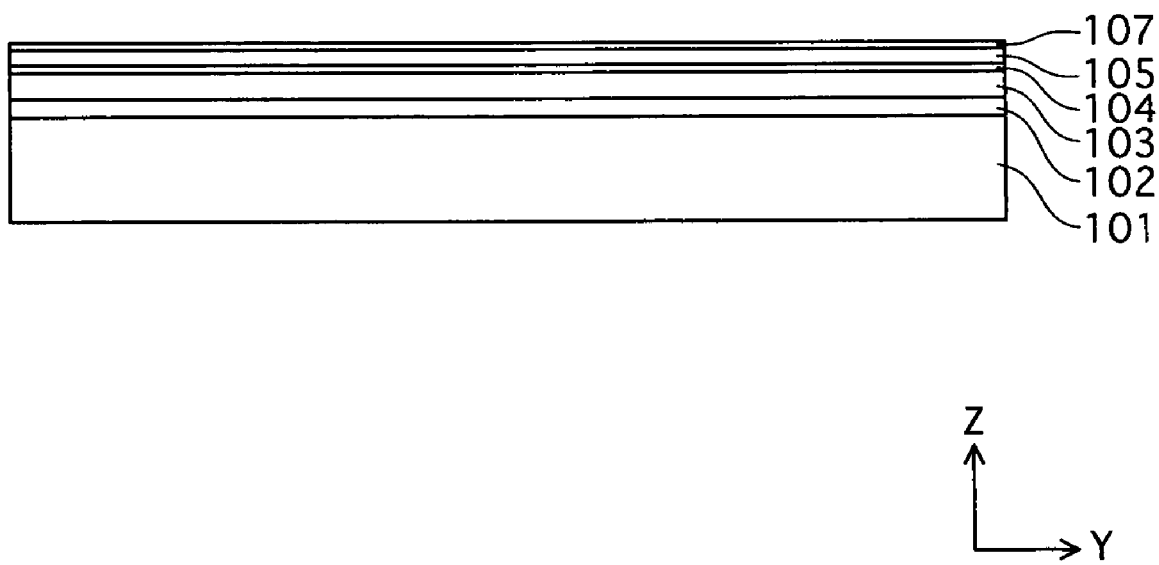
FIG. 13 illustrates a first part of steps of manufacturing a LD 1 wafer of the integrated semiconductor laser diode module of the First Embodiment.
Figure 14:
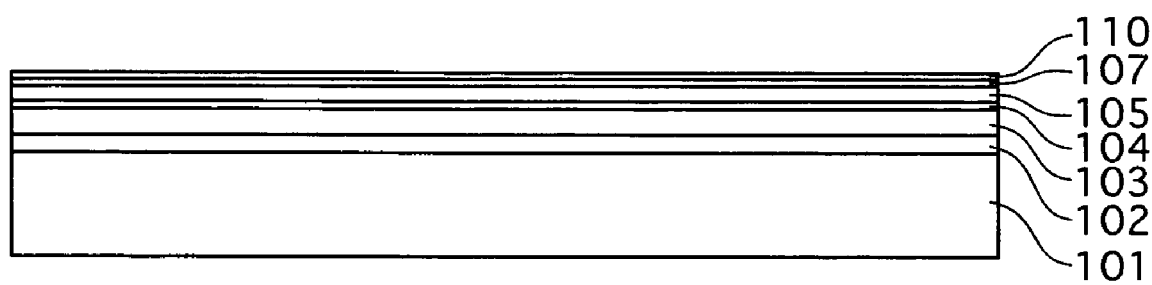
FIG. 14 illustrates a second part of the steps of manufacturing the LD 1 wafer of the integrated semiconductor laser diode module of the First Embodiment.
Figure 14:
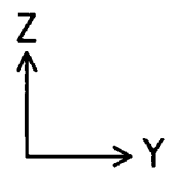

First, as shown in FIG. 13, the gallium nitride semiconductor layers 102-105 and 107 are grown on the GaN (0001) substrate 101 of 400 μm thick, using Metal organic Chemical Vapor Deposition (MOCVD), for example. Next, as shown in FIG. 14, the p-side ohmic electrode 110 is grown on the contact layer 107, using vacuum deposition, for example.

Figure 15:
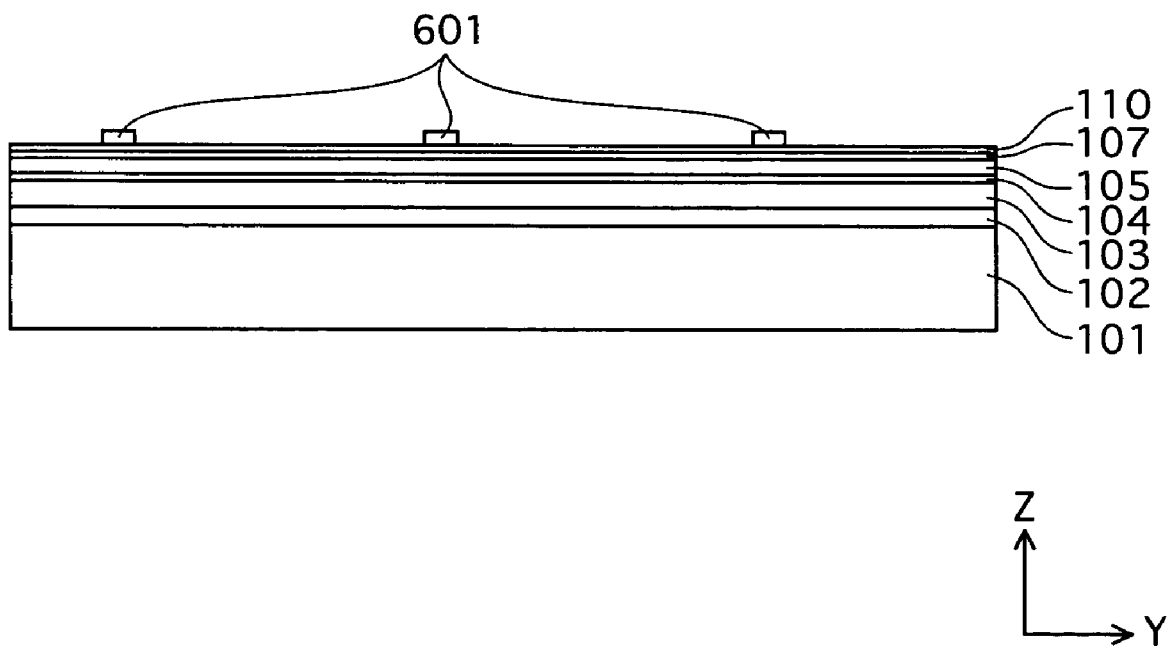
FIG. 15 illustrates a third part of the steps of manufacturing the LD 1 wafer of the integrated semiconductor laser diode module of the First Embodiment.

After forming a $SiO_2$ layer on almost an entire surface of the p-side ohmic electrode 110, as shown in FIG. 15, a mask 601 made of a $SiO_2$ layer in a stripe configuration is formed using a common photolithographic technique.

Figure 16:
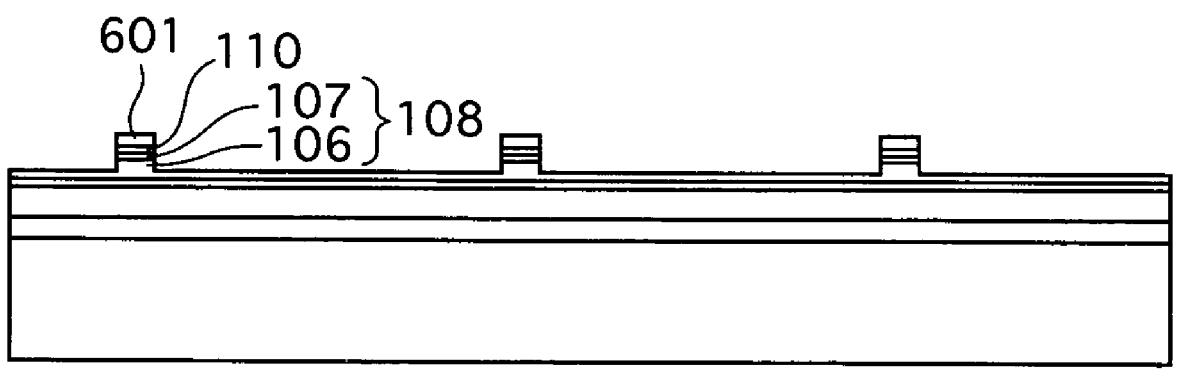
FIG. 16 illustrates a fourth part of the steps of manufacturing the LD 1 wafer of the integrated semiconductor laser diode module of the First Embodiment.
Figure 16:
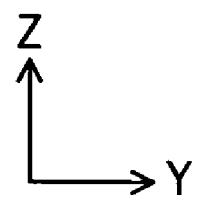
Figure 17:
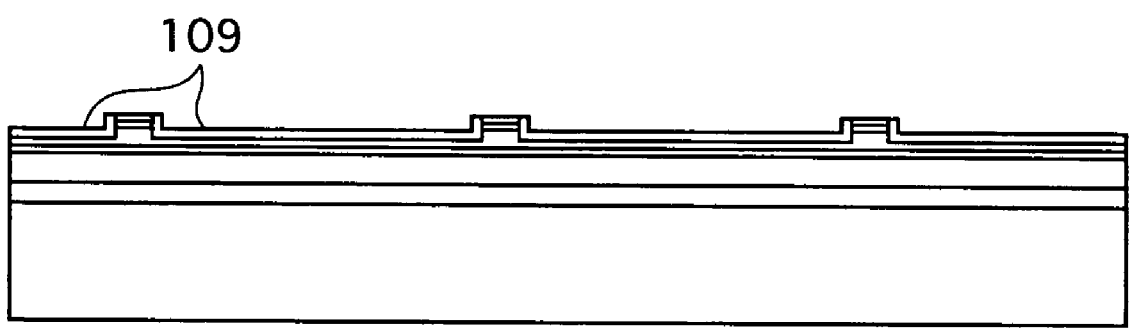
FIG. 17 illustrates a fifth part of the steps of manufacturing the LD 1 wafer of the integrated semiconductor laser diode module of the First Embodiment.
Figure 17:
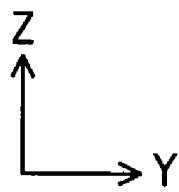

Then, as shown in FIG. 16, etching is performed so as to form the ridge 108 by the RIE method using a $Cl_2$ gas, for example. Further, after temporarily removing the $SiO_2$ mask by a hydrofluoric acid etchant, for example, a $SiO_2$ film (not depicted in the drawings) is formed over almost an entire surface of the wafer. After that, by removing a part of the $SiO_2$ film positioned over the ridge, the dielectric layer 109 is formed, as shown in FIG. 17.

Figure 18:
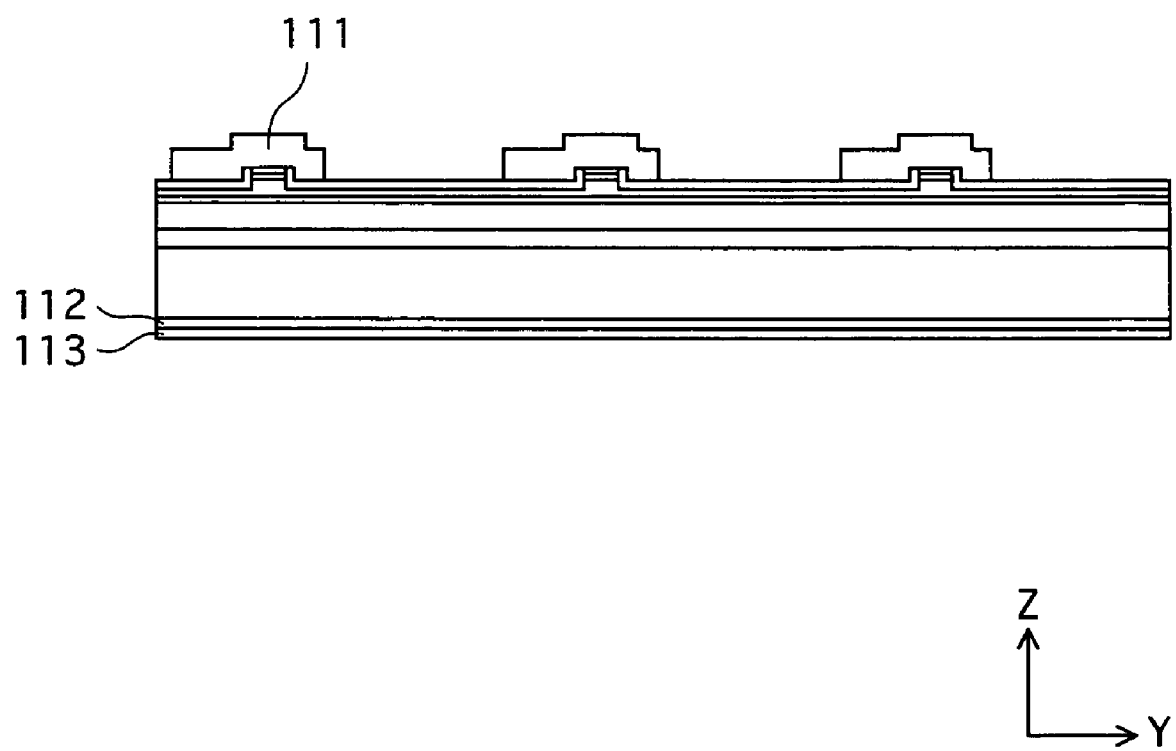
FIG. 18 illustrates a sixth part of the steps of manufacturing the LD 1 wafer of the integrated semiconductor laser diode module of the First Embodiment.

Next, as shown in FIG. 18, after the p-side pad electrode 111 is formed so as to cover an opening of the dielectric layer 109 made of $SiO_2$, a back surface of the GaN substrate 101 is polished, and the n-side ohmic electrode 112 and the n-side pad electrode 113 are formed on the polished back surface.

Figure 19A:
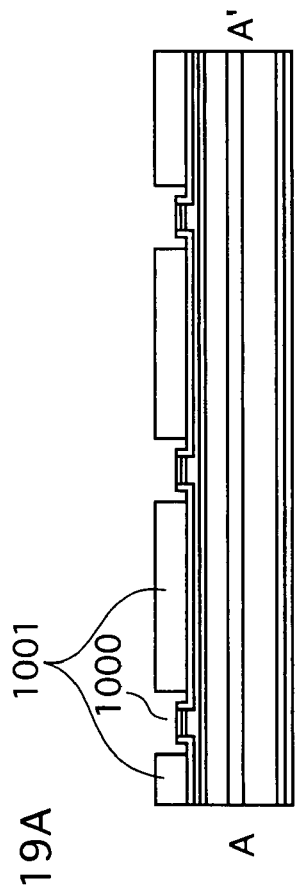
FIGS. 19A-19C illustrate steps for forming facets of the LD 1 of the First Embodiment.
Figure 19B:
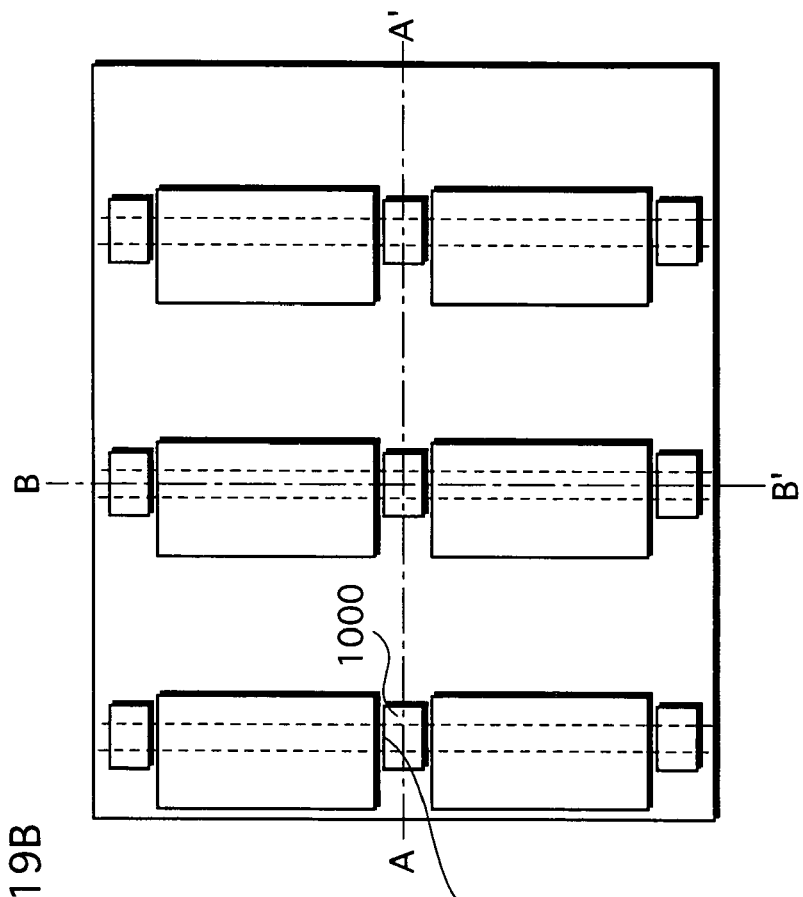
Figure 19C:
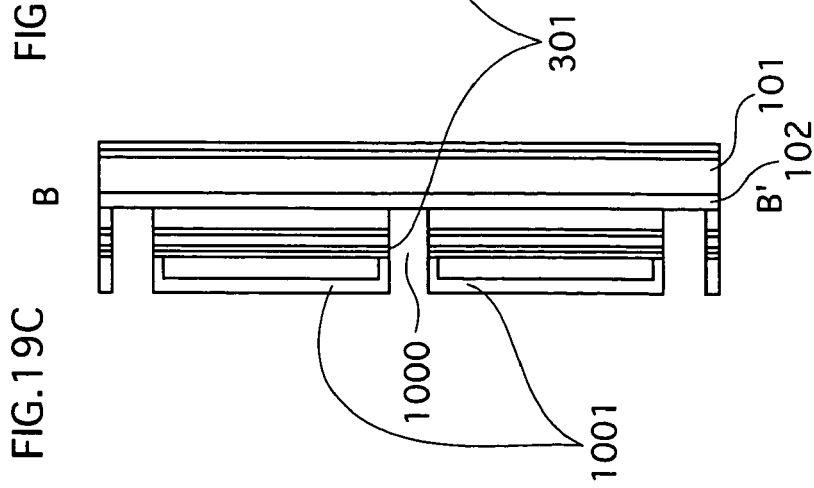

In FIG. 19, A to C illustrate steps of facet forming by etching; B is a top view, A is a sectional view taken at line A-A' of B, and C is a sectional view taken at line B-B' of B. The facets are formed in the following manner. First, a facet forming mask 1001 made of SiO₂ and having a rectangular opening 1000 is formed. Then, etching is performed by the RIE method using a Cl₂ gas, for example. By etching to an upper surface of the n-type layer 102, the facets are formed. The rectangular opening 1000 can be aligned based on a direction in which the ridge 108 lies ((1-100) crystal plane). Accordingly, it is possible to form the facets that match the crystal plane orientation. Moreover, although the etching is performed to an upper surface of the n-type layer 102 in the present invention, it is sufficient, in order to form the facets, to etch to about the middle of the n-type clad layer 103. However, because Al composition in the n-type clad layer 103 is higher than that in the n-type layer 102, it is preferable, as in the present embodiment, to form the facets to reach the upper surface of the n-type layer 102 having a lower Al composition.

Figure 20:
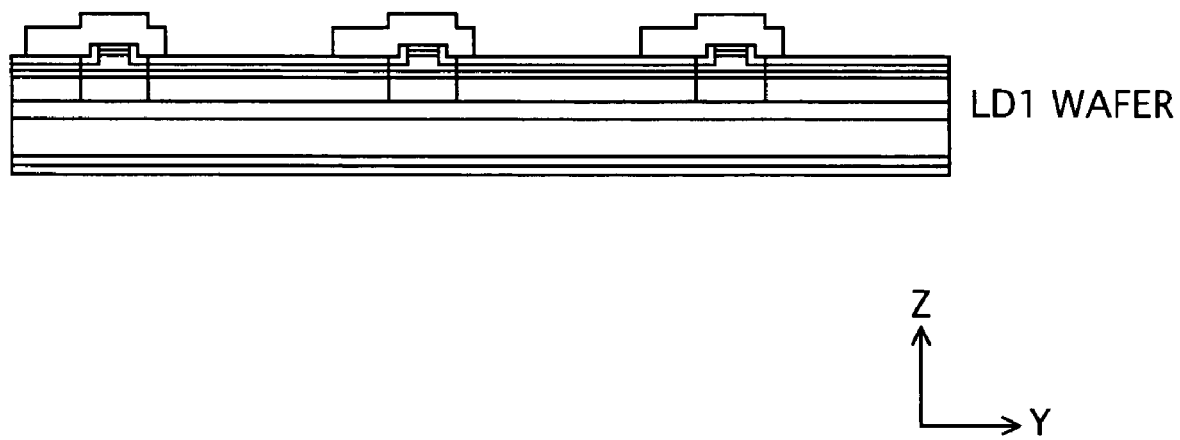
FIG. 20 is a sectional view illustrating the LD 1 wafer of the First Embodiment.
Figure 21:
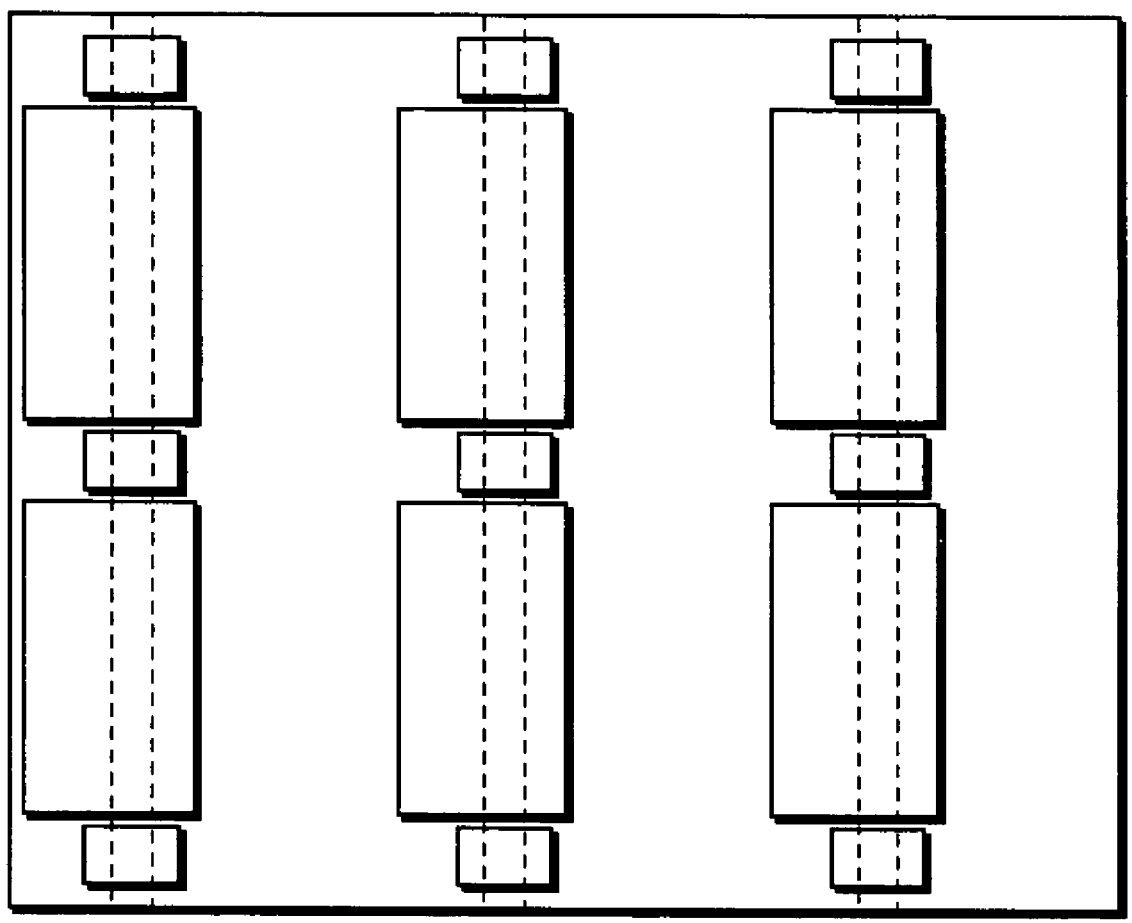
FIG. 21 is a top view illustrating the LD 1 wafer of the First Embodiment.
Figure 21:
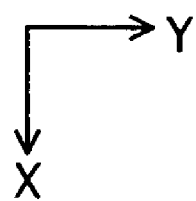
Figure 22:
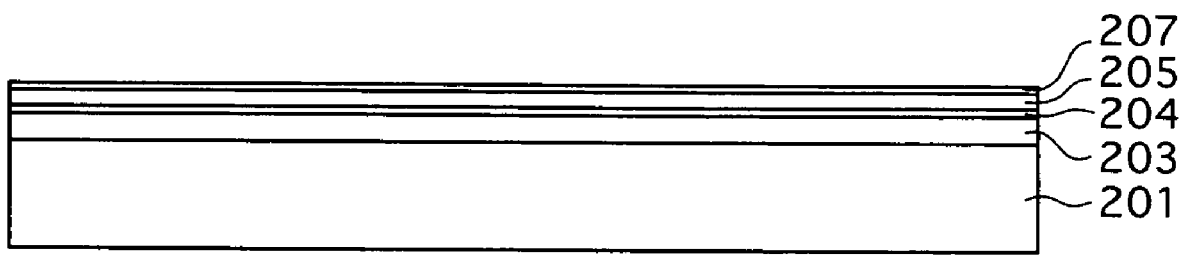
FIG. 22 illustrates a first part of steps of manufacturing a LD 2 wafer of the integrated semiconductor laser diode module of the First Embodiment.
Figure 23:
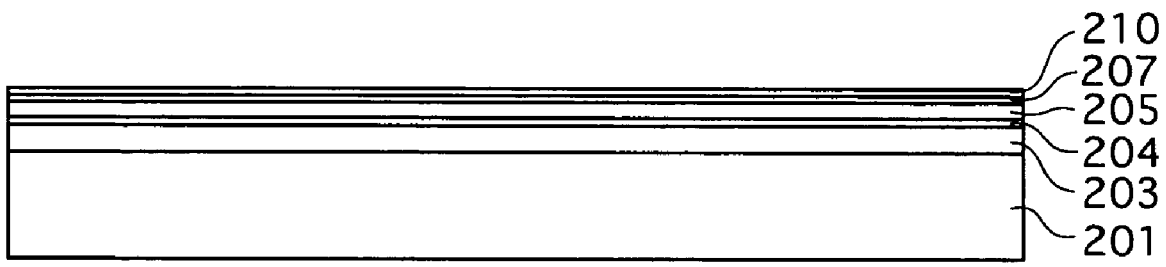
FIG. 23 illustrates a second part of the steps of manufacturing the LD 2 wafer of the integrated semiconductor laser diode module of the First Embodiment.
Figure 24:
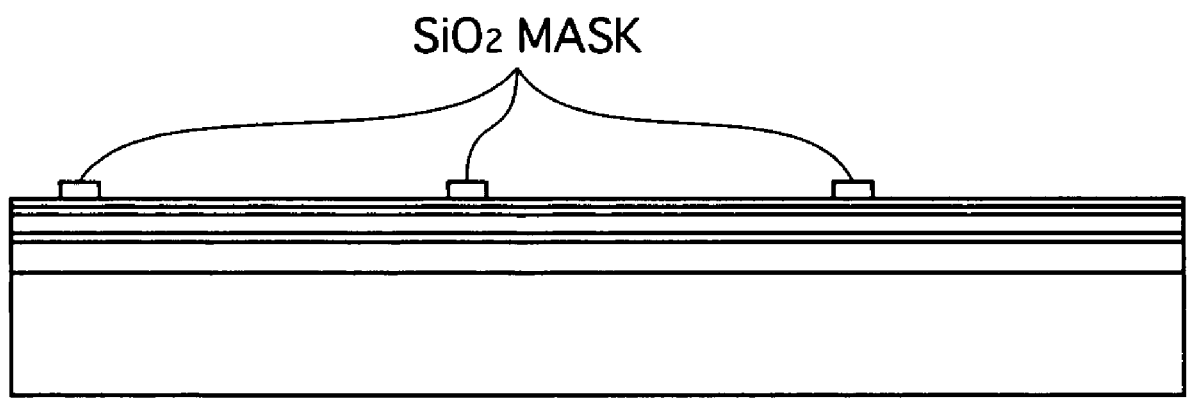
FIG. 24 illustrates a third part of the steps of manufacturing the LD 2 wafer of the integrated semiconductor laser diode module of the First Embodiment.
Figure 25:
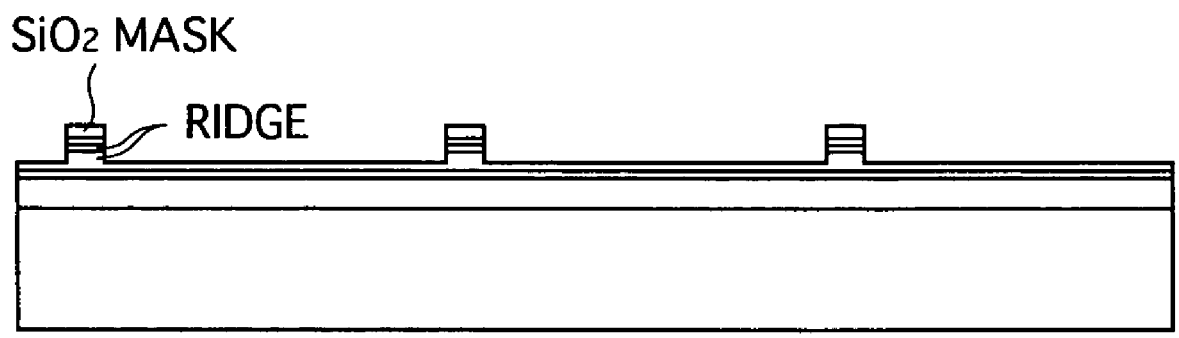
FIG. 25 illustrates a fourth part of the steps of manufacturing the LD 2 wafer of the integrated semiconductor laser diode module of the First Embodiment.
Figure 26:
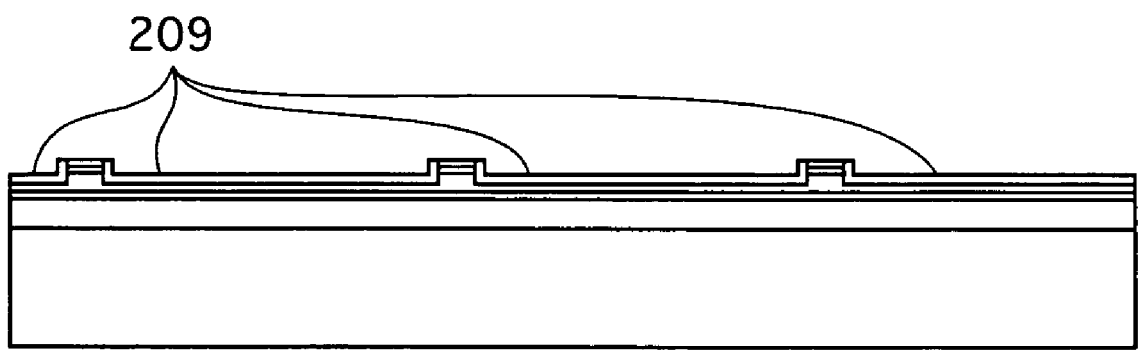
FIG. 26 illustrates a fifth part of the steps of manufacturing the LD 2 wafer of the integrated semiconductor laser diode module of the First Embodiment.
Figure 27:
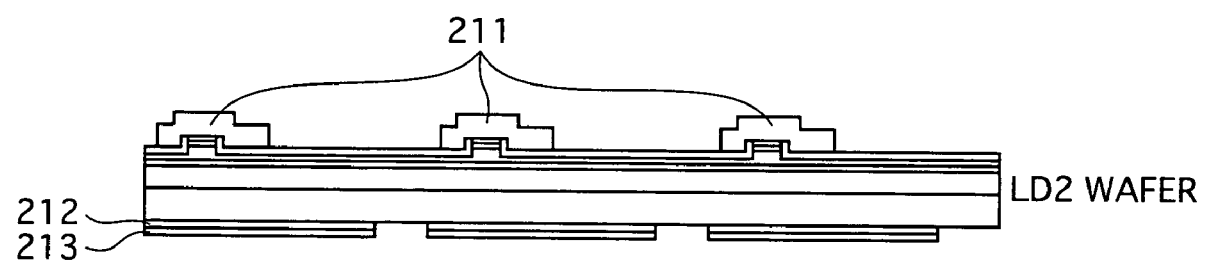
FIG. 27 illustrates a sixth part of the steps of manufacturing the LD 2 wafer of the integrated semiconductor laser diode module of the First Embodiment.

FIG. 20 is a sectional view of the LD 1 wafer formed in this way, viewing in an x-axis direction in FIG. 10. FIG. 21 is a top view of the LD 1 wafer.

FIGS. 22-27 illustrate steps of manufacturing of an LD 2 wafer. The LD 2 wafer is manufactured substantially in the same manner as the LD 1 wafer, except for the following step. Specifically, the n-side ohmic electrode 212 and n-side pad electrode 213 of the LD 2 are formed on the GaAs substrate 201 of 400 μm in thickness, except for a predetermined region on the GaAs substrate 201, after polishing a back surface of the GaAs substrate 201.

The following explains a joining step of the LD 1 wafer and LD 2 wafer manufactured as described above.

Figure 28:
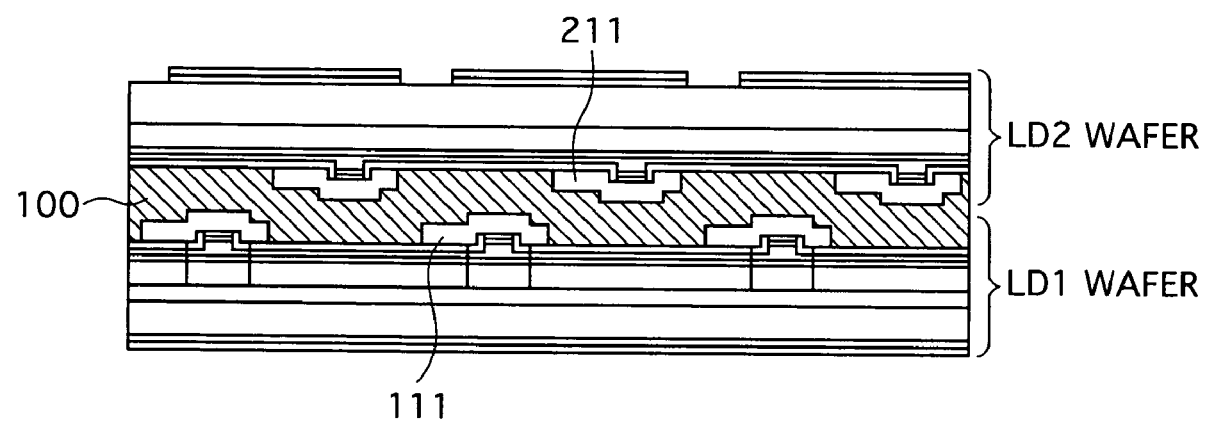
FIG. 28 is a sectional view illustrating steps for joining the LD 1 wafer and LD 2 wafer of the First Embodiment.

First, as shown in FIG. 28, the LD 1 wafer and LD 2 wafer are joined by the joining member 100 so that the p-side pad electrode 111 and 211 face each other. Although AuSn alloy is used as the joining member to join the wafers in the present embodiment, other materials may be used as the joining member in this step. Examples of the other materials include a metal material other than AuSn alloy, a paste containing a conductive material such as an Ag paste, and a conductive resin. Further, the LD 1 wafer and LD 2 wafer may be joined by positioning the wafers to contact each other so that the p-side pad electrode 111 and 211 face each other, and then heating the wafers, in an inert gas atmosphere such as nitrogen and argon, or an atmosphere containing oxygen.

Figure 29:
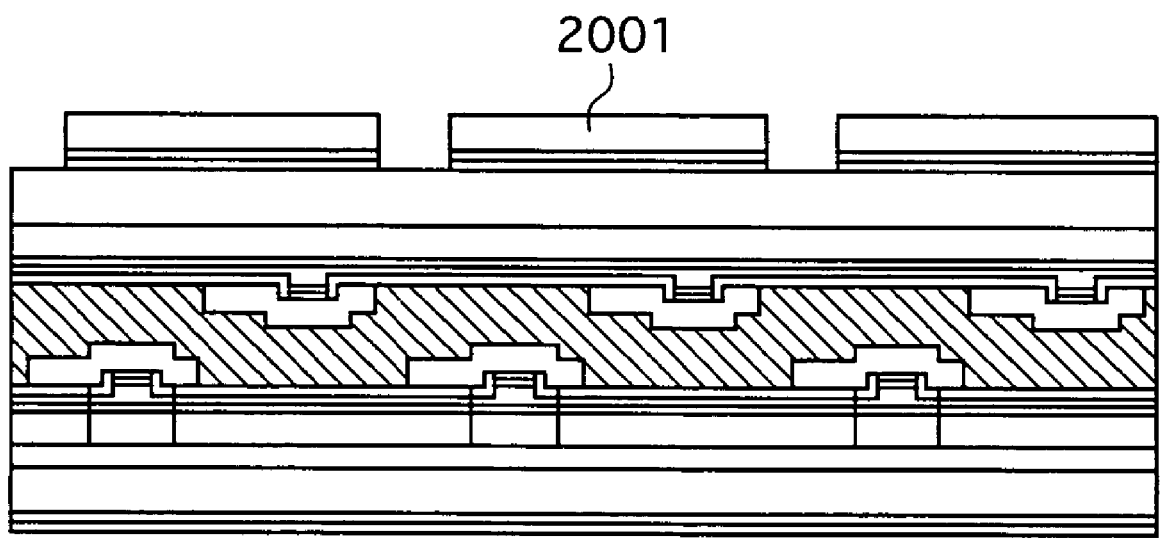
FIG. 29 illustrates a first part of steps of isolation of the integrated semiconductor laser diode modules of the First Embodiment.

Next, as shown in FIG. 29, a mask 2001 made of SiO₂ is formed on a surface opposite to the n-side pad electrode 213 the GaAs substrate 201 of the LD 2.

Figure 30:
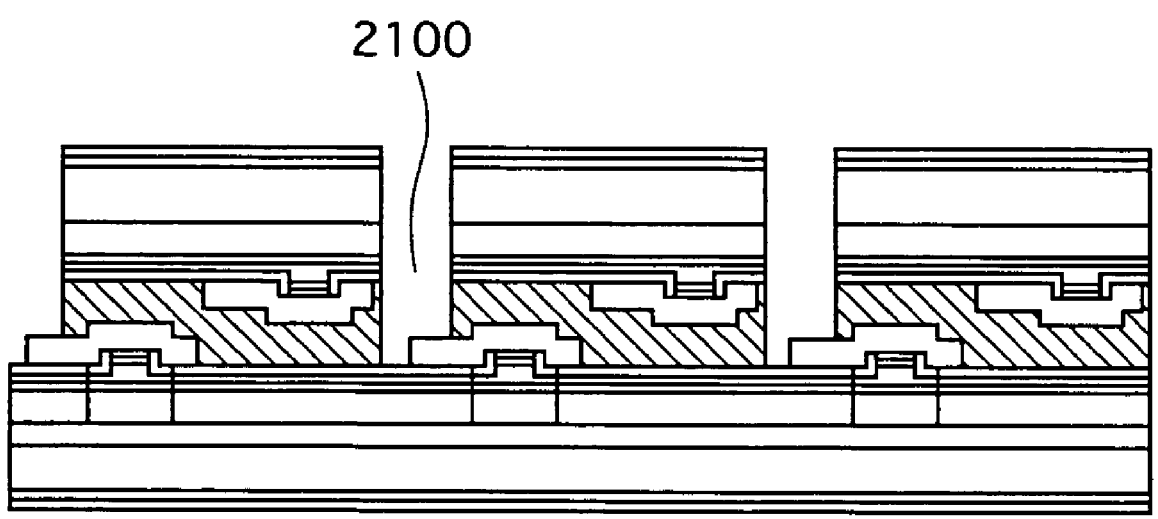
FIG. 30 illustrates a second part of steps of isolation of the integrated semiconductor laser diode modules of the First Embodiment.

Then, by sequentially applying aqua regia, a mixed solution of ammonia and hydrogen peroxide, and the hydrofluoric acid etchant, etching is performed to, in an order from the back surface of the GaAs substrate 201, the GaAs substrate 201, semiconductor layers 203-205 and 207, the dielectric layer 209, the joining member 100 are etched. Thus, an opening 2100 from the back surface to the p-side pad electrode 111, as shown in FIG. 30, is formed. A combined body of the wafers joined together in the above manner is then separated into modules each including the LD 1 and LD 2, thereby obtaining the integrated semiconductor laser diode module shown in FIGS. 10-12.

Second Embodiment

Figure 31:
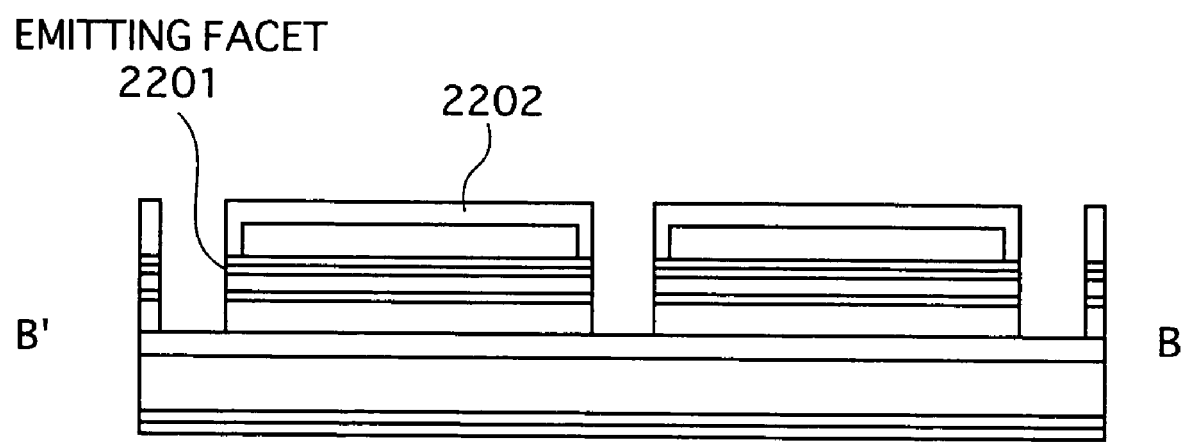
FIG. 31 illustrates a first part of steps of forming a first coating film on the edge facets of the LD 1 of the integrated semiconductor laser diode module of a Second Embodiment according to the present invention.

The following explains a Second Embodiment with reference to FIGS. 31-36. In the Second Embodiment, the reflectance of the emitting facets, from which laser beams are emitted, of the LD 1 and LD 2 are separately optimized. FIG. 31 shows a step of forming a first coating film, after the steps shown by A-C in FIG. 19 of exposing the facets by making the opening 1000 to the LD 1. This drawing is a sectional view corresponding to C of FIG. 19.

Figure 32:
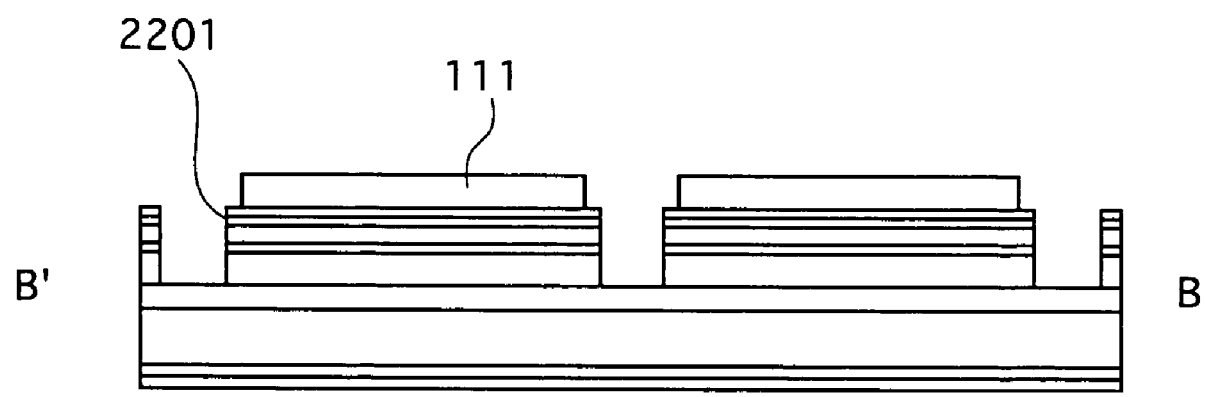
FIG. 32 illustrates a second part of the steps of forming the first coating film on the edge facets of the LD 1 of the integrated semiconductor laser diode module of the Second Embodiment according to the present invention.
Figure 33:
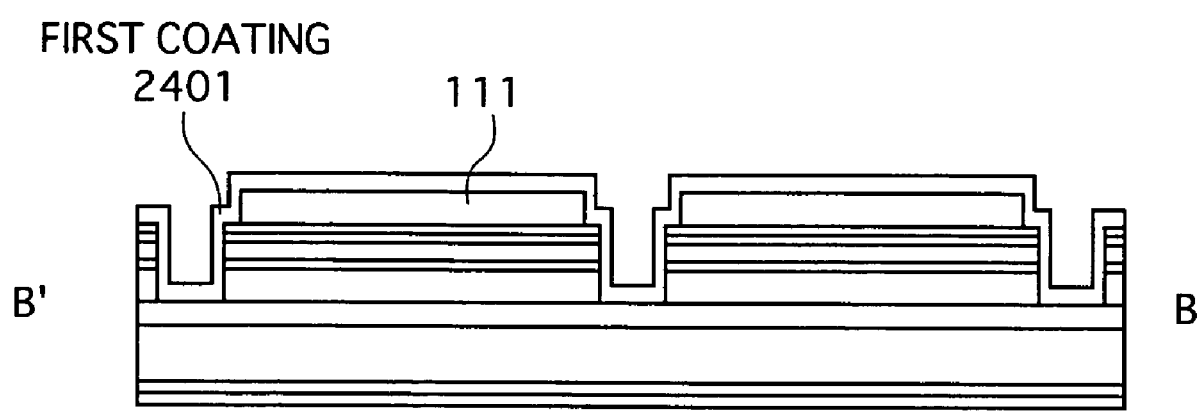
FIG. 33 illustrates a third part of the steps of forming the first coating film on the edge facets of the LD 1 of the integrated semiconductor laser diode module of the Second Embodiment according to the present invention.

After forming an emitting facet 2201 of the LD 1, a SiO₂ mask 2202 for forming the facets is removed using the hydrofluoric acid etchant, for example (FIG. 32). Note that the emitting facet 2201 is just an example of "an emitting facet of a laser diode". Further, as shown in FIG. 33, a first coating film 2401 is formed so as to be about 73 nm in thickness on the facets. The first coating film 2401 made of SiO₂ film is then formed on an upper surface of the LD 1 wafer using the plasma CVD method, for example.

Figure 34:
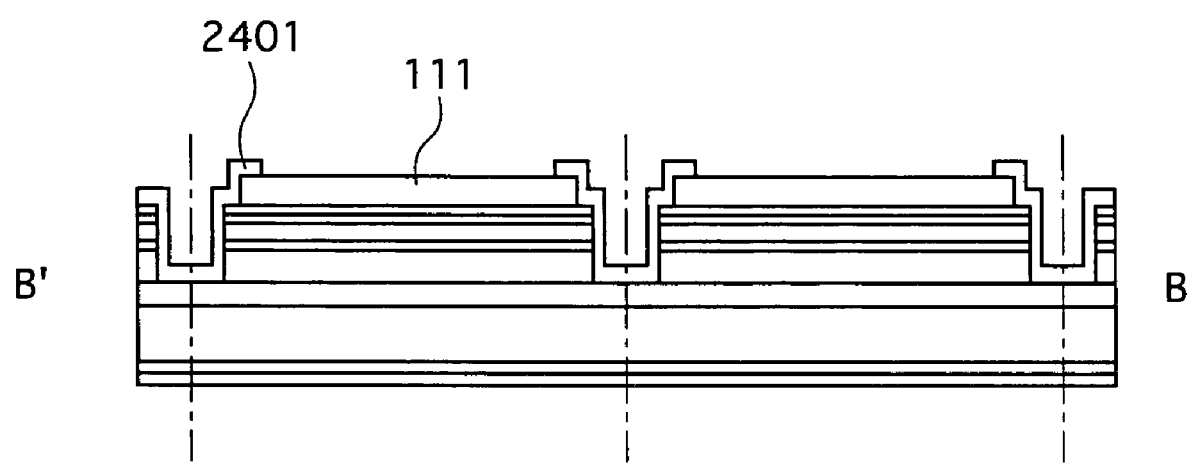
FIG. 34 illustrates a first part of steps of forming a second coating film on the edge facets of the LD 1 of the integrated semiconductor laser diode module of the Second Embodiment according to the present invention.

Next, as shown in FIG. 34, the first coating film 2401 at a predetermined region is removed, so that the p-side pad electrode 111 of the LD 1 is exposed, using such as the hydrofluoric acid etchant.

Further, as shown in FIG. 30, after joining the LD 1 wafer and LD 2 wafer and forming the opening 2100 in the GaAs substrate of the LD 2 wafer by etching, a plurality of bars each containing the integrated semiconductor laser diode module can be obtained by cleaving at parts indicated by dashed lines in FIG. 34.

Figure 35:
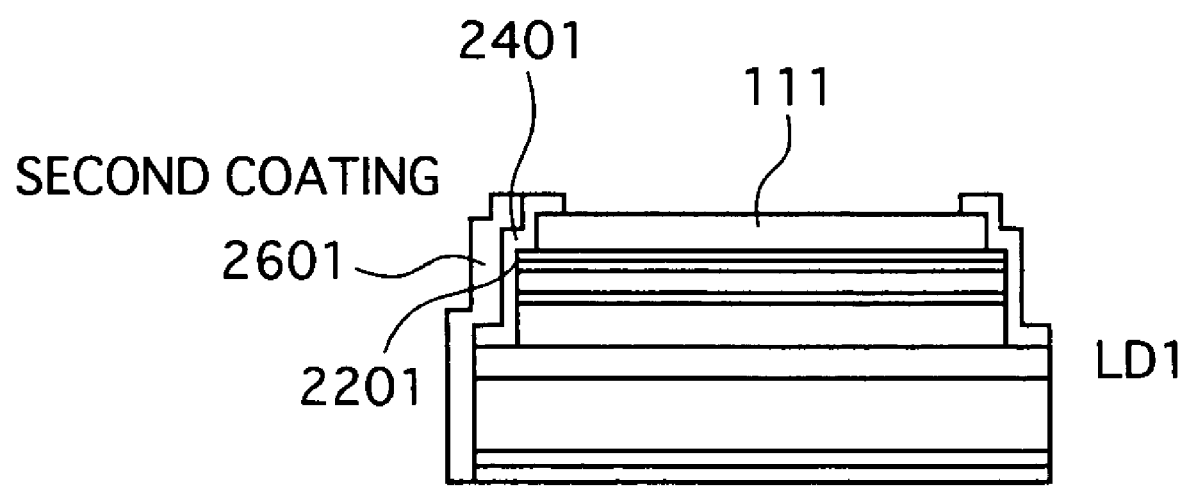
FIG. 35 illustrates a second part of the steps of forming the first coating film on the edge facets of the LD 1 of the integrated semiconductor laser diode module of the Second Embodiment according to the present invention.

Then, as shown in FIG. 35, a second coating film 2601 that is 110 nm in thickness and made of SiO₂ is formed on a side of the emitting facet 2201 of the LD 1 (front side of the LD 1), by vacuum deposition, for example. A total thickness of SiO₂ formed on the front side of the LD 1 is 183 nm, and the reflectance in this case is about 7%.

Figure 36:
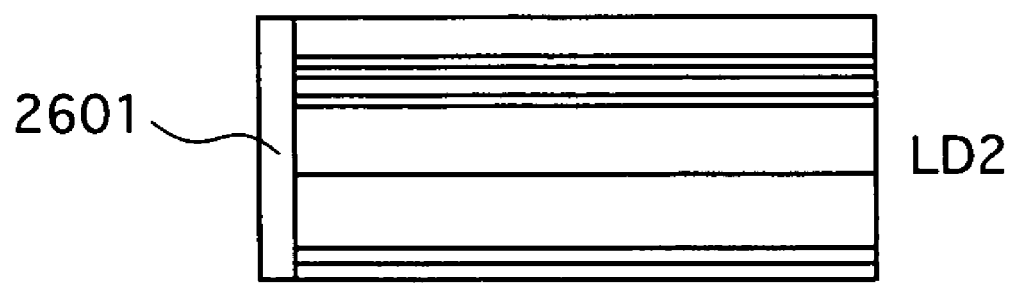
FIG. 36 illustrates a step of forming the first coating film on the edge facets of the LD 2 of the integrated semiconductor laser diode module of the Second Embodiment according to the present invention.

On the other hand, as shown in FIG. 36, only the second coating film 2601 that is 110 nm in thickness and made of SiO₂ is formed on a front side of the LD 2. In this case, it is possible to make the reflectance at the front side of the LD 2 about 7%, which is about the same as the reflectance for the LD 1.

Here, with the conventional manufacturing method, the same kind of coating film (the second coating film in the present embodiment) is formed on the front side of the LD 1 and LD 2, specifically, on the emitting facets obtained by cleaving the combined body of the wafers in which the laser diodes are integrated. This makes it difficult to form a suitable coating for each of the laser diodes. Assuming that the conventional method is applied to the present embodiment, a coating film to be formed on the front sides of the LD 1 and LD 2 after the cleaving is 110 nm in thickness and made of SiO₂, which means that while the reflectance at the front side of the LD 2 is about 7%, the reflectance at the front side of the LD 1 is about 12.3%. This makes it difficult to improve the laser beam output from the LD 1.

As described above, according to the present embodiment, it is possible to make the reflectance about 7% at the front side of both the LD 1 and LD 2. It is also possible to form a coating film suitable for each laser diode, and thus high output operation can be easily realized with both of the laser diodes.

In the present embodiment, both of the first coating film 2401 and second coating film 2601 are made of SiO₂. However, the coating films can be made of different materials. By using different materials for the first coating film and second coating film, optimization of the reflectance at the front side of the laser diodes can be done even more easily. It is possible to make the reflectance about 7% at the front side of both the LD 1 and LD 2, by forming a coating film that is 105 nm in thickness and made of $SiO_2$ as the first coating film on the front side of the LD 1, and forming an $Al_2O_3$ coating film that is 77 nm in thickness on the front side of the bars formed after the joining of the the LD 1 wafer and LD 2 wafer, for example.

It is also possible to form a coating on a reflecting facet (back facet) on which the laser beams are reflected can be controlled for each of the LD 1 and LD 2, as in the case of the present embodiment.

As the coating film for the back facet, such a multi-layer in which $Al_2O_3$ layers and amorphous silicon layers are laminated alternately, a multi-layer in which $SiO_2$ layers and SiN layers are laminated alternately, and a multi-layer in which $SiO_2$ layers and $TiO_2$ layers are laminated alternately may be used. By controlling the thickness, it is also possible to control separately the reflectance of the LD 1 and LD 2.

Third Embodiment

An example described by the above first and second embodiments, as shown in FIG. 28, is such that the back surfaces of the substrates of the LD 1 and LD 2 are polished to make the substrates thinner, the n-side ohmic electrode and n-side pad electrode are formed on the substrate, and then the LD 1 wafer and LD 2 wafer are joined together. However, in the third embodiment, first, the wafers are joined together, next, the substrates are made thinner by polishing, and then, the n-side ohmic electrode and n-side pad electrode are formed on the back surfaces of the substrates.

FIGS. 37-41 are schematic views to explain such steps.

Figure 37:
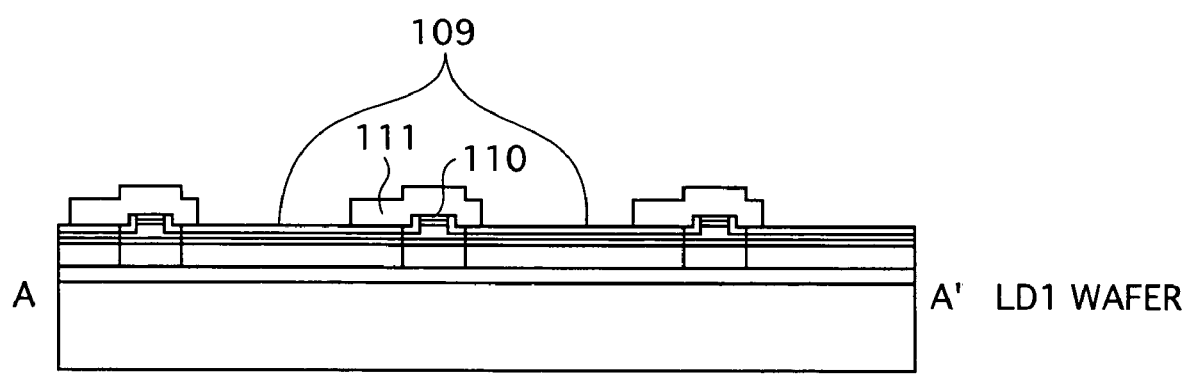
FIG. 37 illustrates a first part of steps of forming n-side ohmic electrodes and n-side pad electrodes on the LD 1 and LD 2 of the integrated semiconductor laser diode module of a Third Embodiment according to the present invention.

FIG. 37 illustrates the LD 1 wafer before joining. The LD 1 wafer is manufactured in the same steps described in FIG. 17 of the present invention, and then completed by forming the p-side pad electrode 111 over the p-side ohmic electrode 110 so as to cover the opening of the dielectric layer 109.

Figure 38:
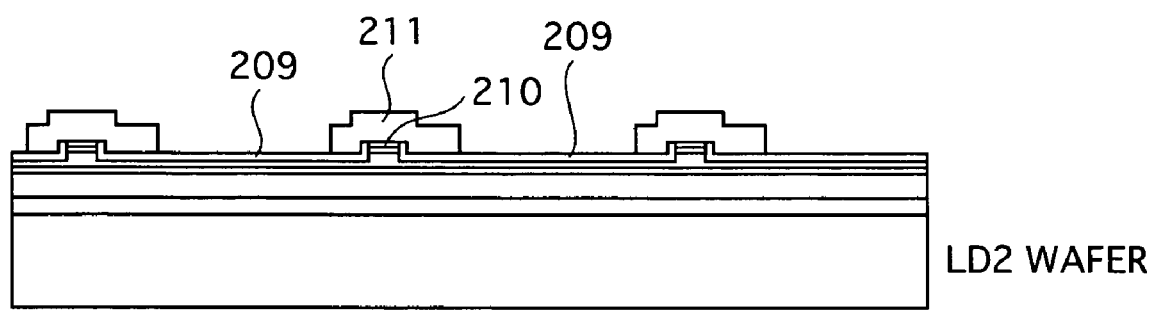
FIG. 38 illustrates a second part of the steps of forming the n-side ohmic electrodes and n-side pad electrodes on the LD 1 and LD 2 of the integrated semiconductor laser diode module of the Third Embodiment according to the present invention.

FIG. 38 illustrates the LD 2 wafer before joining. The LD 2 wafer is manufactured in the same steps described in FIG. 26 of the present invention, and then completed by forming the p-side pad electrode 211 over the p-side ohmic electrode 210 so as to cover the opening of the dielectric layer 209.

After that, the wafers illustrated in FIGS. 37 and 38 are joined together so that the p-side pad electrodes 111 and 211 face each other. In the joining step, the wafers are joined by AuSn alloy as the joining member, as in the first embodiment. Also, other materials may be used as the joining member. Examples of the other materials include a metal material other than AuSn alloy, a paste containing a conductive material such as an Ag paste, and a conductive resin. Further, the LD 1 wafer and LD 2 wafer may be joined by positioning the wafers to contact each other so that the p-side pad electrode 111 and 211 face each other, and then heating the wafers, in an inert gas atmosphere such as nitrogen and argon, or an atmosphere containing oxygen.

Figure 39:
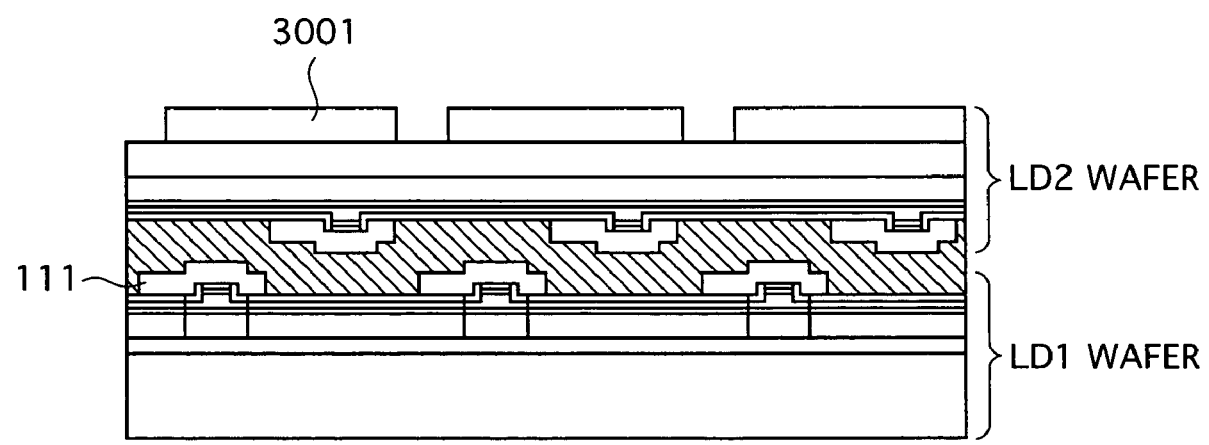
FIG. 39 illustrates a third part of the steps of forming the n-side ohmic electrodes and n-side pad electrodes on the LD 1 and LD 2 of the integrated semiconductor laser diode module of the Third Embodiment according to the present invention.
Figure 40:
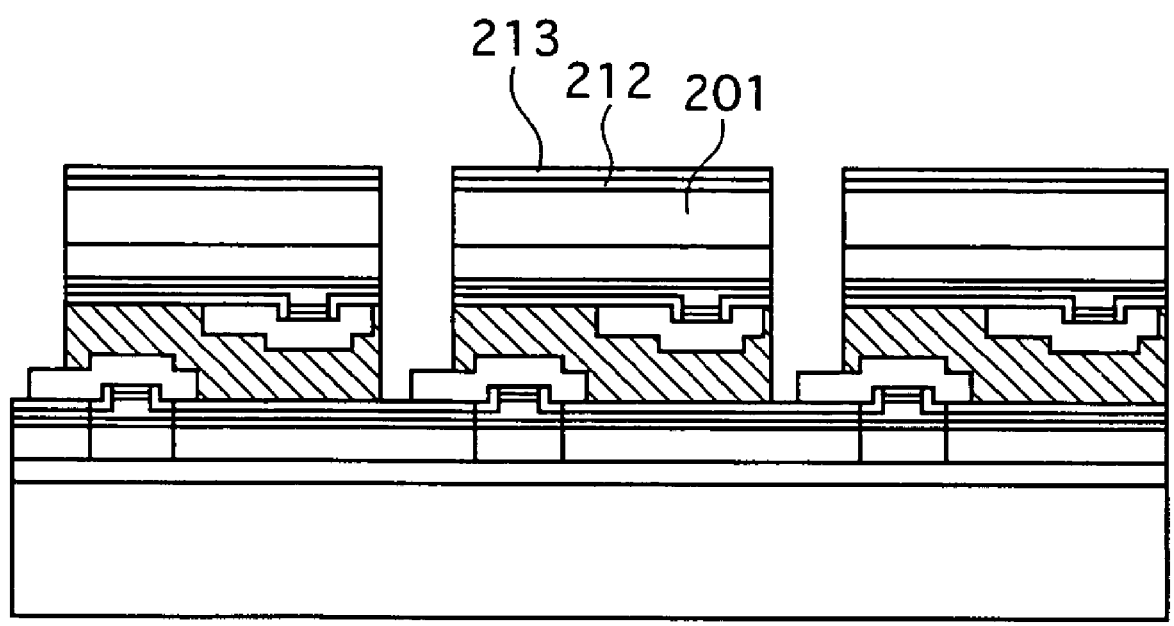
FIG. 40 illustrates a fourth part of the steps of forming the n-side ohmic electrodes and n-side pad electrodes on the LD 1 and LD 2 of the integrated semiconductor laser diode module of the Third Embodiment according to the present invention.

The the LD 2 wafer that has been joined is made thin so that the substrate is as thin as about 80 μm by polishing the back surface of the substrate 201 (a side opposite to the joining surface) or by wet etching. Then, as shown in FIG. 39, a $SiO_2$ mask 3001 having an opening is formed on the back surface of the substrate 201 of the LD 2 wafer. A position of the opening corresponds to a position of the p-side pad electrode 111 of the LD 1. Further, as in the first and second embodiments, by sequentially applying aqua regia, a mixed solution of ammonia and hydrogen peroxide, and the hydrofluoric acid etchant, etching is performed to, in an order from the back surface of the GaAs substrate 201, the GaAs substrate 201, semiconductor layers 203-205 and 207, the dielectric layer 209, the joining member 100 are etched. Thus, an opening 2100 from the back surface to the p-side pad electrode 111, as shown in FIG. 30, is formed. Then, the $SiO_2$ mask 3001 is removed, and as shown in FIG. 40, the n-side ohmic electrode 212 and n-side pad electrode 213 are formed, in a stated order, at a predetermined region on the back surface of the GaAs substrate 201 of the LD 2.

Figure 41:
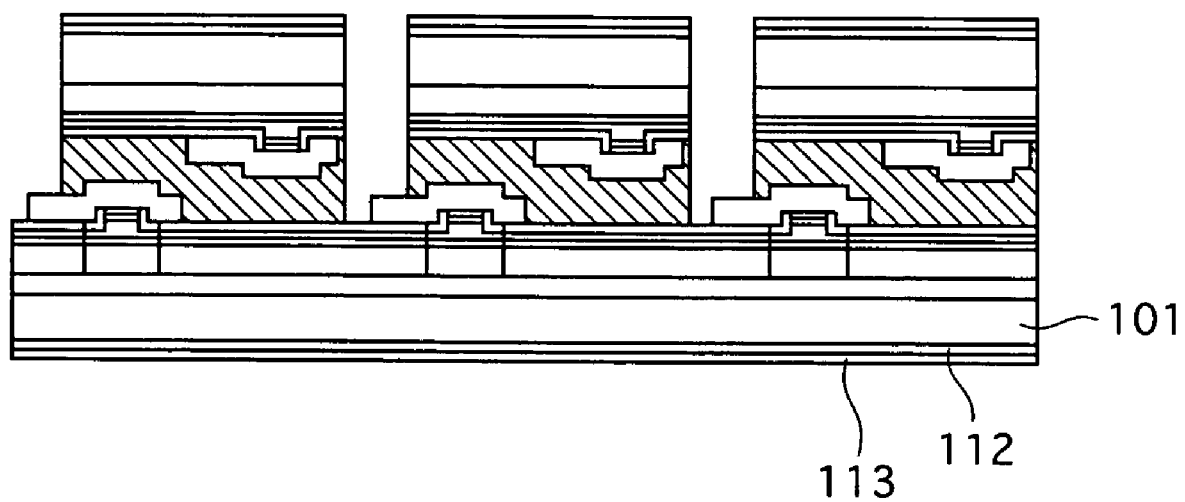
FIG. 41 illustrates a fifth part of the steps of forming the n-side ohmic electrodes and n-side pad electrodes on the LD 1 and LD 2 of the integrated semiconductor laser diode module of the Third Embodiment according to the present invention.

In the next step, by polishing or etching the back surface of the GaN substrate 101 of the LD 1 wafer, the thickness of the substrate is made around 60 μm. Then, as shown in FIG. 41, the n-side ohmic electrode 112 and n-side pad electrode 113 are formed, in a stated order, on the back surface of the LD 1 wafer.

As explained above, the combined body in which the LD 1 wafer and LD 2 wafer are joined together is separated into modules so that each module includes a LD 1 and a LD 2. Thus, the integrated semiconductor laser diode module is obtained.

In the first and second embodiment, the joining step is performed after making the LD 1 wafer and LD 2 wafer thin by polishing or etching. In a case in which the LD 1 wafer and LD 2 wafer become too thin, the wafers can easily get broken in the joining step. On the other hand, in the present embodiment, the LD 1 wafer and LD 2 wafer are made thin by polishing or etching the substrates after the joining. Thus, it is possible to make the wafers thinner than the wafers manufactured in the first and second embodiments.

Further, in the present embodiment, the GaN substrate 101 as the substrate for the LD 1 is transparent, and the n-side ohmic electrode and n-side pad electrode are not yet formed on the back surface of the LD 1 wafer in the joining step. Therefore, it is possible to observe the p-side ohmic electrode 110 and p-side pad electrode 111 of the LD 1 wafer from the back surface of the GaN substrate 101 through the semiconductor layers 102-105 and 107, and the dielectric layer 109. Therefore, it is possible to see the ridge 108, i.e. a light emitting region, of the LD 1 wafer from the back surface of the GaN substrate 101 through the semiconductor layers 102-105 and 107, and the dielectric layer 109.

In addition, by using a transparent material for the joining member 100, it is possible to observe a position of the p-side pad electrode 211 of the LD 2 wafer from the back surface of the substrate 101 of the LD 1 wafer through the semiconductor layers 102-105 and 107, and the dielectric layer 109. Therefore, it is possible to see the ridge 208, i.e. a light emitting region of the LD 2 wafer the back surface of the GaN substrate 101 through the semiconductor layers.

Alternatively, the joining member may be formed in advance at a predetermined part of the joining surface of the LD 1 wafer and LD 2 wafer, instead of an entire joining surface of the LD 1 wafer and LD 2 wafer. By this, it is possible to observe the position of the p-side pad electrode 211, i.e. the light emitting region of the LD 2 wafer from the back surface of the substrate 101 of the LD 1 wafer through the semiconductor layers 102-105 and 107, and the dielectric layer 109. Specifically, the AuSu alloy can be formed in advance on the p-side pad electrode 111 of the LD 1 wafer and the p-side pad electrode 211 of the LD 2 wafer, so as to substantially match the forming region of the pad electrodes.

Further, the joining member is not used, in the case in which the LD 1 wafer and LD 2 wafer are joined in a manner that the wafers are positioned so as to contact each other and the p-side pad electrode 111 and 211 face each other, and then the wafers are heated in an atmosphere of hydrogen, an atmosphere of an inert gas such as nitrogen and argon, or an atmosphere of oxygen. Accordingly, it is possible to confirm the position of the p-side pad electrode 211 i.e. light emitting region of the LD 2 wafer from the back surface of the substrate 101 of the LD 1 wafer through the semiconductor layers 102-105 and 107, and the dielectric layer 109.

As described above, in the present invention, it is possible to join the wafers while confirming the positions of the ridge 108 (the light emitting region) of the LD 1 wafer from the substrate 101 of the LD 1 wafer and the ridge 208 (the light emitting region) of the LD 2 wafer. As a result, the positions of light emitting points and the directions of the resonators of the laser diodes may be controlled easily and accurately. Thus, the integrated semiconductor laser diode module whose positions of light emitting points are controlled at high accuracy is obtained.

Note that all the embodiments described above are examples and do not restrict the scope of the present invention. The scope of the present invention is defined by the claims, and not by the description of the above embodiments. Therefore, the present invention includes equivalents of what is defined by the claims and any kind of modification within the scope of the invention.

In the above first to third embodiments, an example is described that both facets of the first laser diode (the LD 1) are formed by etching in manufacturing the integrated semiconductor laser diode module, which is structured by joining the first laser diode (the LD 1) and the second laser diode (the LD 2). It is also possible to obtain the same effect as described in the first to third embodiments, even in a case only one facet of the first laser diode (the LD 1), the emitting facet, for example, is formed by the etching, and then the other facet (the reflecting facet) is formed by the cleaving after the joining, at the same time when the facets of the second laser diode (the LD 2) are formed. In this case, performance of the first laser diode (the LD 1) becomes slightly low, because of a possibility that the reflecting facet is not aligned with the crystal plane orientation. However, because the part where the temperature is highest when driving a laser diode is the emitting facet, and because the emitting facets of both laser diodes are out of alignment, an influence of the low performance to the lifetime of the laser diode is not large.

In the above first embodiment, the GaN substrate 101 is used as the substrate to form the LD 1. However, the substrate 101 is not limited to this example. Such as an InGaN substrate, an AlGaN substrate, and an AlGaInN substrate as well as an AlGaInBN substrate that B is added to AlGaInN may also be used. Further, substrate such as $ZrB_2$ substrate may be used. Because a lattice constant of $ZrB_2$ is close to a lattice constant of GaN, it is possible to form a gallium nitride semiconductor with an excellent crystallinity. Moreover, a sapphire substrate may also be used. In this case, however, a difference between crystal axes of the gallium nitride semiconductor and sapphire substrate becomes about 30°, in order to obtain flat facets easily. Therefore, performance can be low in comparison with the cases in which the other materials above mentioned are used as the substrate, because misalignment in the direction that the ridges extend can easily occur.

In addition, in the above first embodiment, the GaN substrate 101 and GaAs substrate 201 remain in the final laser diode module. However, after the wafers are joined, one of the substrates may be completely removed. The present invention is also effective in such a case.

Further, in the above first and second embodiments, the nitride semiconductor layers are laminated on a (0001) plane of the nitride semiconductor. However, the present invention is not restricted to this example, and the layers maybe laminated in a direction of a different plane of the nitride semiconductor. For example, the nitride semiconductor layers may be laminated on such as a (1-100) plane, a (11-20) plane, and (H, K, —H, —K, 0) plane of the nitride semiconductor. In this case, the emission layer does not include piezoelectric fields, and therefore the luminous efficiency of the emission layer is improved.

Moreover, the above first and second embodiments described the examples in which the MQW structure is used for the emission layer. However, the same effect as in the first and second embodiments is obtained even when the emission layer is a single layer of a thick film or a layer of a single quantum well structure.

Because of the high performance and long lifetime, the integrated semiconductor laser diode module and a manufacturing method thereof according to the present invention is highly applicable as an optical pick-up device for conventional high capacity optical disc systems such as a CD system and a DVD system, as well as next generation high capacity optical disc systems such as a Blu-ray system and an HD-DVD system.

In the above embodiments, the laser diode having AlGaInP semiconductor layers on the GaAs substrate is used as the LD 2. However, it is also possible to use a laser diode having AlGaAs semiconductor layers on the GaAs substrate.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. An integrated semiconductor laser diode module comprising:
    a first wafer including a first substrate and at least one first laser diode on a first surface of the first substrate, the at least one first laser diode being made of a nitride semiconductor;
    a second wafer including a second substrate and at least one second laser diode on a second surface of the second substrate, the at least one second laser diode being made of one of (a) a gallium arsenide semiconductor, (b) an aluminum gallium indium phosphide semiconductor, and (c) an indium phosphide semiconductor; and
    a joining member for joining the first wafer to the second wafer so that said first surface overlaps said second surface, wherein
    the at least one first laser diode has a first resonator,
    the at least one second laser diode has a second resonator whose length is greater than a length of the first resonator, and
    the at least one first laser diode is joined to the at least one second laser diode in a manner that the first resonator and second resonator are substantially parallel in a lengthwise direction thereof, and at least one of (a) emitting facets of the first resonator and second resonator, and (b) reflecting facets of the first resonator and second resonator are not on the same plane.

2. An integrated semiconductor laser diode module according to claim 1, wherein
    the emitting facets of the first resonator and second resonator are not on the same plane.

3. An integrated semiconductor laser diode module according to claim 2, wherein
    the reflecting facets of the first resonator and second resonator are not on the same plane.

4. An integrated semiconductor laser diode module according to claim 3, wherein
the first laser diode and second laser diode are made of different semiconductor materials.

5. An integrated semiconductor laser diode module according to claim 4, wherein
the first laser diode and second laser diode have different crystal structures.

6. An integrated semiconductor laser diode module according to claim 5, wherein
the first laser diode is made of a nitride semiconductor,
a first coating film is formed on the emitting facet of the first laser diode, and
a second coating film is formed on the first coating film and the emitting facet of the second laser diode.

7. An integrated semiconductor laser diode module according to claim 2, wherein
the first laser diode and second laser diode are made of different semiconductor materials.

8. An integrated semiconductor laser diode module according to claim 1, wherein
the first laser diode and second laser diode are made of different semiconductor materials.

9. An integrated semiconductor laser diode module according to claim 1, wherein
the emitting facet and the reflecting facet of the first resonator are positioned between the emitting facet and the reflecting facet of the second resonator.

* * * * *